(12) United States Patent
Kang et al.

(10) Patent No.: US 9,536,580 B2
(45) Date of Patent: Jan. 3, 2017

(54) CLOCK SIGNAL PROCESSOR AND NON-VOLATILE MEMORY DEVICE INCLUDING THE SAME

(71) Applicants: Kyoung-Tae Kang, Seoul (KR); Sang-Lok Kim, Seoul (KR); Dae-Hoon Na, Seoul (KR)

(72) Inventors: Kyoung-Tae Kang, Seoul (KR); Sang-Lok Kim, Seoul (KR); Dae-Hoon Na, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/803,618

(22) Filed: Jul. 20, 2015

(65) Prior Publication Data
US 2016/0104520 A1 Apr. 14, 2016

(30) Foreign Application Priority Data
Oct. 8, 2014 (KR) ........................ 10-2014-0136219

(51) Int. Cl.
| | | |
|---|---|---|
| *G11C 8/00* | (2006.01) | |
| *G11C 7/22* | (2006.01) | |
| *G11C 16/04* | (2006.01) | |
| *G11C 16/32* | (2006.01) | |

(52) U.S. Cl.
CPC ............ *G11C 7/222* (2013.01); *G11C 16/0483* (2013.01); *G11C 16/32* (2013.01)

(58) Field of Classification Search
CPC ....... G11C 11/4076; G11C 7/222; G11C 7/22; G11C 11/40615; G11C 7/1042; G11C 11/408; G11C 11/4082; G11C 11/4087; G11C 11/4091; G11C 2207/2281; G11C 2207/229; G11C 7/065

USPC .......... 365/189.05, 233.1, 189.02, 194, 220, 365/226, 227, 230.03, 230.08, 233.11, 365/233.12, 233.13, 233.14, 233.17
See application file for complete search history.

(56) References Cited

U.S. PATENT DOCUMENTS

| | | | |
|---|---|---|---|
| 6,934,215 B2 | 8/2005 | Chung et al. | |
| 7,075,856 B2 | 7/2006 | Labrum et al. | |
| 8,049,545 B2 | 11/2011 | Kim et al. | |
| 2006/0001463 A1 | 1/2006 | Lee et al. | |
| 2007/0176657 A1 | 8/2007 | Byun et al. | |
| 2007/0230559 A1 | 10/2007 | Kris et al. | |
| 2011/0248752 A1* | 10/2011 | Willey | H03K 5/1565 327/117 |
| 2014/0105063 A1 | 4/2014 | Jeong et al. | |
| 2014/0119133 A1 | 5/2014 | Willey et al. | |
| 2015/0188527 A1* | 7/2015 | Francom | H03K 5/14 327/158 |

FOREIGN PATENT DOCUMENTS

| | | |
|---|---|---|
| JP | 2014-090381 A | 5/2014 |
| KR | 0645461 B | 11/2006 |
| KR | 0759786 B | 9/2007 |
| KR | 1158531 B | 6/2012 |

\* cited by examiner

*Primary Examiner* — Thong Q Le
(74) *Attorney, Agent, or Firm* — Volentine & Whitt, PLLC

(57) ABSTRACT

A clock signal processor includes a duty cycle corrector, a switch point calculator, and a multiplexer. The duty cycle corrector generates a second clock signal by modifying a duty cycle of a first clock signal. The switch point calculator activates a switch signal at an end of a latency period in which a read command is provided to a non-volatile memory device and an invalid data is read from the non-volatile memory device. The multiplexer outputs one of the first and second clock signals as a third clock signal based on the switch signal.

20 Claims, 23 Drawing Sheets

154

155

CLOCK SIGNAL PROCESSOR AND NON-VOLATILE MEMORY DEVICE INCLUDING THE SAME

CROSS-REFERENCE TO RELATED APPLICATION

This U.S. Non-provisional application claims priority under 35 USC §119 to Korean Patent Application No. 10-2014-0136219, filed on Oct. 8, 2014, in the Korean Intellectual Property Office (KIPO), the disclosure of which is incorporated by reference in its entirety herein.

BACKGROUND

1. Technical Field

Example embodiments relate generally to a clock signal processor, and more particularly to a clock signal processor executing a duty cycle correction and a non-volatile memory device including the same.

2. Discussion of the Related Art

Recently, components, such as a processor and a memory included in a general electronic device, transceive data with each other in synchronization with clock signals. However, errors may occur when the data are transceived between the components if a duty cycle error occurs due to the mismatch in length between a logic low level duration and a logic high level duration of the clock signal.

For instance, in the case of a DDR (double data rate) memory, the data are transceived at every rising edge and falling edge of the clock signal. If the duty cycle error occurs in the clock signal, a data transceiving interval may not be constantly maintained, so an error may occur when the data are transceived between the DDR memory and the processor.

Thus, it may be necessary to execute a duty cycle correction (DCC) with maintaining performance of the DDR non-volatile memory device.

SUMMARY

At least one example embodiment of the inventive concept provides a clock signal processor executing a duty cycle correction of a clock signal during a latency period of a non-volatile memory device.

At least one example embodiment of the inventive concept provides a non-volatile memory device including a clock signal processor executing a duty cycle correction of a clock signal during a latency period of a non-volatile memory device.

At least one example embodiment of the inventive concept provides a method for executing a duty cycle correction of a clock signal during a latency period of a non-volatile memory device.

According to example embodiments, a clock signal processor includes a duty cycle corrector, a switch point calculator, and a multiplexer. The duty cycle corrector generates a second clock signal by modifying a duty cycle of a first clock signal. The switch point calculator activates a switch signal at an end point of a latency period in which a read command is provided to a non-volatile memory device and an invalid data is read from the non-volatile memory device. The multiplexer outputs one of the first and second clock signals as a third clock signal based on the switch signal.

In an example embodiment, the duty cycle corrector may generate the second clock signal by modifying the duty cycle of the first clock signal in the latency period.

In an example embodiment, the duty cycle corrector may modify the duty cycle of the first clock signal such that a duty cycle of the second clock signal becomes 50%.

In an example embodiment, the duty cycle corrector may include an edge detector and a phase interpolator. The edge detector may bypass the first clock signal. The edge detector may generate a first delayed clock signal by delaying the first clock signal based on delay signals. The edge detector may generate a first inverted clock signal by inverting the first delayed clock signal. The phase interpolator may generate the second clock signal by mixing the first clock signal and the first inverted clock signal.

In an example embodiment, the edge detector and the phase interpolator may start operating from the latency period.

In an example embodiment, the duty cycle corrector may further include a delay register configured to store the delay signals.

In an example embodiment, the edge detector may generate the delay signals and store the delay signals to the delay register when a write command is provided to the non-volatile memory device before executing the read command. The phase interpolator may operate from the latency period based on the delay signals stored in the delay register.

In an example embodiment, a delay length of the second clock signal from the first clock signal may be the same as a length of logic high level duration included in a period of the first clock signal.

In an example embodiment, the edge detector may include a delay chain unit and a processing unit. The delay chain unit may have a plurality of delay units generating temporary delayed clock signals by delaying the first clock signal respectively. The processing unit may generate the delayed signals based on the first clock signal and the temporary delayed clock signals, and may output a temporary delayed clock signal corresponding to an activated delay signal as the first delay clock signal.

In an example embodiment, the phase interpolator may include a phase mixer and a schmitt trigger circuit. The phase mixer may generate a mixed clock signal by mixing the first clock signal and the first inverted clock signal. The schmitt trigger circuit generates the second clock signal by clarifying a logic value characteristic of the mixed clock signal.

In an example embodiment, the switch point calculator may operate based on the first clock signal, a use signal, and a latency length signal.

In an example embodiment, when the latency length signal is 1, the switch point calculator may determine a first period of the first clock signal after deactivation of the use signal as the latency period.

In an example embodiment, when the latency length signal is 2, the switch point calculator may determine first and second periods of the first clock signal after deactivation of the use signal as the latency period.

In an example embodiment, the switch point calculator may deactivate the switch signal before the end point of the latency period, and the switch point calculator may activate the switch signal from the end point of the latency period.

In an example embodiment, the multiplexer may output the first clock signal as the third clock signal when the switch signal is deactivated, and the multiplexer may output the second clock signal as the third clock signal when the switch signal is activated.

According to example embodiments, a non-volatile memory device includes a memory cell array, a control circuit, an address decoder, and a data I/O circuit. The control circuit generates a row address signal and a column address signal based on a command signal and an address signal. The control circuit includes a clock signal processor generating a data strobe signal based on a second read clock signal, which is changed from a first read clock signal during a read operation. The address decoder activates a word line corresponding to the row address signal. The data I/O circuit receives read data of memory cells connected to the word line through a plurality of bit lines based on the column address signal, and outputs the read data as a data signal. The clock signal processor includes a duty cycle corrector, a switch point calculator, and a multiplexer. The duty cycle corrector generates a third read clock signal by modifying a duty cycle of the second read clock signal. The switch point calculator activates a switch signal at an end point of a latency period in which a read command is provided as the command signal and an invalid data is read from the non-volatile memory device. The multiplexer outputs one of the second and third read clock signals as the data strobe signal based on the switch signal.

In an example embodiment, the duty cycle corrector may generate the third read clock signal by modifying the duty cycle of the second read clock signal in the latency period.

In an example embodiment, the duty cycle corrector may modify the duty cycle of the second read clock signal such that a duty cycle of the third read clock signal is halved.

In an example embodiment, the duty cycle corrector may include an edge detector, and a phase interpolator. The edge detector may bypass the second read clock signal. The edge detector may generate a second delayed read clock signal by delaying the second read clock signal based on delay signals. The edge detector may generate a second inverted read clock signal by inverting the second delayed read clock signal. The phase interpolator may generate the third read clock signal by mixing the second read clock signal and the second inverted read clock signal.

In an example embodiment, the edge detector and the phase interpolator may start operating from the latency period.

In an example embodiment, the a delay length of the third read clock signal from the second read clock signal may be the same as a length of a logic high level duration included in a period of the second read clock signal.

According to example embodiments, a method of processing a clock signal includes: outputting an input clock signal of a non-volatile memory device as an output clock signal; generating a modified input clock signal by modifying a duty cycle of the input clock signal during a latency period in which a read command is provided to the non-volatile memory device and an invalid data is read from the non-volatile memory device; and outputting the modified input clock signal as the output clock signal from an end point of the latency period.

As described above, the clock signal processor and the non-volatile memory device including the clock signal processor according to example embodiments may execute the duty cycle correction of the clock signal in the latency period included in the operation of the non-volatile memory device without affecting time overhead.

BRIEF DESCRIPTION OF THE DRAWINGS

Example embodiments of the inventive concept will be more clearly understood from the following detailed description taken in conjunction with the accompanying drawings.

DETAILED DESCRIPTION OF THE EMBODIMENTS

Figure 1:
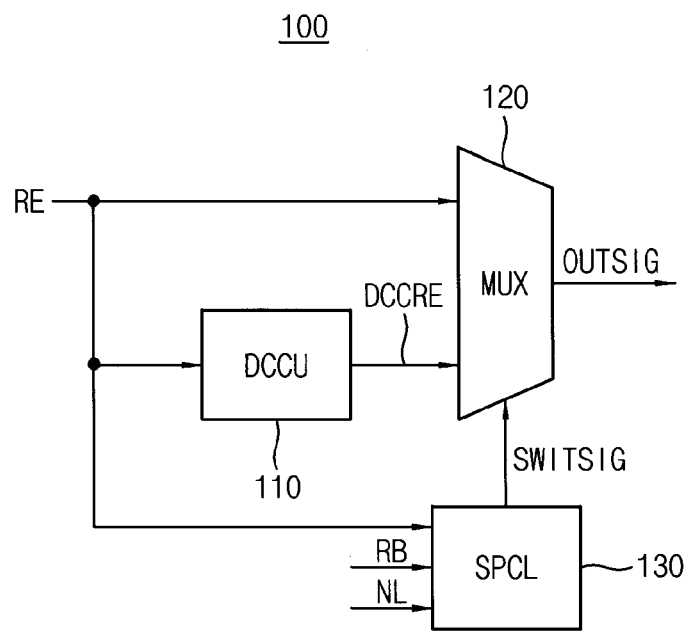
FIG. 1 is a block diagram illustrating a clock signal processor according to an example embodiment.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a clock signal processor according to an example embodiment. Referring to FIG. 1, a clock signal processor 100 includes a duty cycle corrector DDCU 110, a switch point calculator SPCL 130, and a multiplexer MUX 120.

The duty cycle corrector 110 generates a second clock signal DCCRE by modifying a duty cycle of a first clock signal RE. The structure and operation of the duty cycle corrector 110 will be described with the reference to FIGS. 2 through 14.

The switch point calculator 130 activates a switch signal SWITSIG at an end point of a latency period in which a read command is provided to a non-volatile memory device and an invalid data is read from the non-volatile memory device. The switch point calculator 130 may operate based on the first clock signal RE, a use signal RB, and a latency length signal NL.

In an example embodiment, when the latency length signal NL is 1, the switch point calculator 130 may determine a first period of the first clock signal RE after deactivation of the use signal RB as the latency period. In another example embodiment, when the latency length signal NL is 2, the switch point calculator 130 may determine first and second periods of the first clock signal RE after deactivation of the use signal RB as the latency period.

The switch point calculator 130 may deactivate the switch signal SWITSIG before the end point of the latency period, and the switch point calculator 130 may activate the switch signal SWITSIG from the end point of the latency period. Operation of the switch point calculator 130 will be described with the references to FIGS. 7 through 9.

The multiplexer 120 outputs one of the first and second clock signals RE, DCCRE as a third clock signal OUTSIG based on the switch signal SWITSIG. The multiplexer 120 may output the first clock signal RE as the third clock signal OUTSIG when the switch signal SWITSIG is deactivated, and the multiplexer 120 may output the second clock signal DCCRE as the third clock signal OUTSIG when the switch signal SWITSIG is activated.

In an example embodiment, the duty cycle corrector 110 may generate the second clock signal DCCRE by modifying the duty cycle of the first clock signal RE in the latency period. In another example embodiment, the duty cycle corrector 110 may modify the duty cycle of the first clock signal RE such that a duty cycle of the second clock signal DCCRE is halved or becomes 50%.

Figure 2:
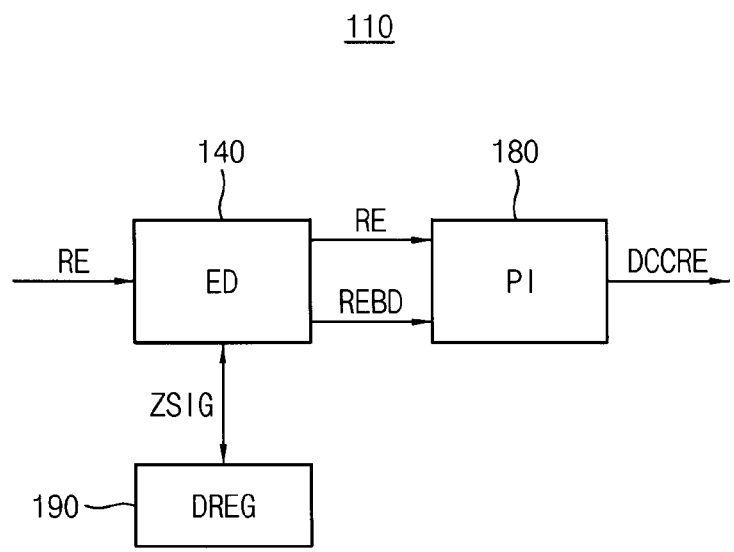
FIG. 2 is a block diagram illustrating an example duty cycle corrector included in the clock signal processor of FIG. 1.

FIG. 2 is a block diagram illustrating an example of a duty cycle corrector included in the clock signal processor of FIG. 1. Referring to FIG. 2, the duty cycle corrector 110 may include an edge detector ED 140, a phase interpolator PI 180, and a delay register DREG 190.

The edge detector 140 may bypass the first clock signal RE. The edge detector 140 may generate delay signals ZSIG. The edge detector 140 may generate the first delayed clock signal by delaying the first clock signal RE as much as a length of the logic high level duration, which may be referred to as a half-edge, based on the delay signals ZSIG. The edge detector 140 may generate a first inverted clock signal REBD by inverting the first delayed clock signal. The structure and operation of the edge detector 140 will be described with the reference to FIGS. 3 through 9.

The phase interpolator 180 may generate the second clock signal DCCRE by mixing the first clock signal RE and the first inverted clock signal REBD. The delay register 190 may store the delay signals ZSIG.

In an example embodiment, the edge detector 140 and the phase interpolator 180 may start operating from the latency period.

In another example embodiment, the edge detector 140 may generate the delay signals ZSIG and store the delay signals ZSIG to the delay register 190 when a write command is provided to the non-volatile memory device before execution of the read command. The phase interpolator 180 may operate from the latency period based on the delay signals ZSIG stored in the delay register 190. The example embodiments will be described with the reference to FIG. 9.

Figure 3:
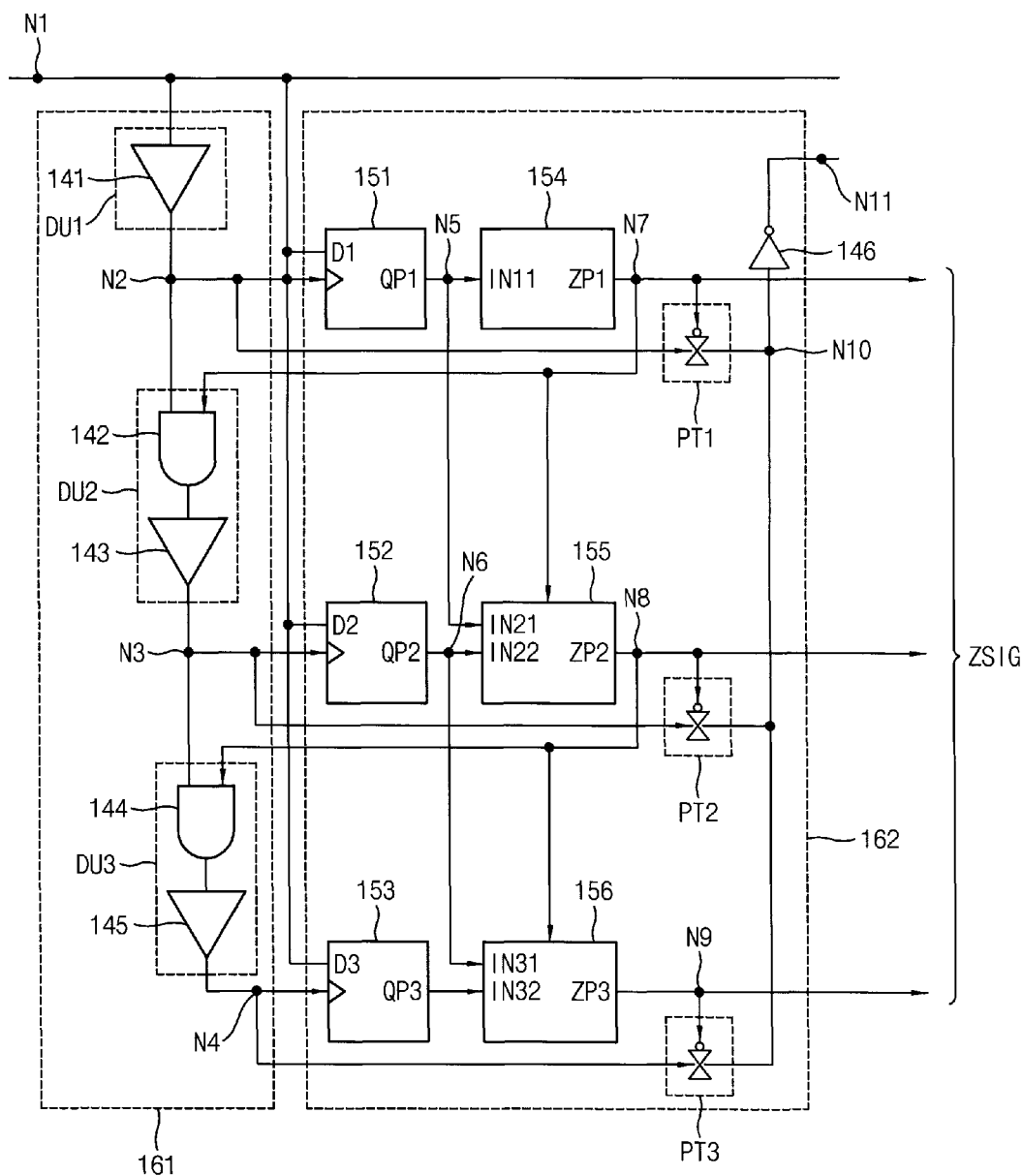
FIG. 3 is a block diagram illustrating an example edge detector included in the duty cycle corrector of FIG. 2.

FIG. 3 is a block diagram illustrating an example edge detector included in the duty cycle corrector of FIG. 2. Referring to FIG. 3, the edge detector 140 may include a delay chain 161 unit and a processing unit 162. The delay chain unit 161 may have a first delay unit DU1, a second delay unit DU2, and a third delay unit DU3. The processing unit 162 may include a first D flip-flop 151, a second D flip-flop 152, and a third D flip-flop 153, a first detection unit 154, a second detection unit 155, a third detection unit 156, a first pass transistor PT1, a second pass transistor PT2, a third pass transistor PT3, and a first inverter 146. The delay chain unit 161 may further include more delay units other than the first delay unit DU1, the second delay unit DU2, and the third delay unit DU3. The processing unit 162 may further include more D flip-flops other than the first D flip-flop 151, the second D flip-flop 152, and the third D flip-flop 153. The processing unit 162 may further include more detection units other than the first detection unit 154, the second detection unit 155, and the third detection unit 156. The processing unit 162 may further include more pass transistors other than the first pass transistor PT1, the second pass transistor PT2, and the third pass transistor PT3.

The delay units DU1, DU2, and DU3 may generate the temporary delayed clock signals by delaying the first clock signal RE, respectively. In detail, the first delay unit DU1 may generate a first temporary delayed clock signal by delaying the first clock signal RE. The second delay unit DU2 may generate a second temporary delayed clock signal by delaying the first temporary delayed clock signal. The third delay unit DU3 may generate a third temporary delayed clock signal by delaying the second temporary delayed clock signal. The processing unit 162 may generate the delayed signals ZSIG based on the first clock signal RE and the temporary delayed clock signals, and may output a temporary delayed clock signal corresponding to an activated delay signal as the first delay clock signal.

The delay signal ZSIG may include a first delay signal, a second delay signal, and a third delay signal. The delay signal ZSIG may further include more delay signals other than the first through third delay signals.

The first delay unit DU1 may include a first buffer 141. The second delay unit DU2 may include a first AND gate 142, and a second buffer 143. The third delay unit DU3 may include a second AND gate 144, and a third buffer 145.

A voltage signal of a first node N1 may be the first clock signal RE. A voltage signal of a second node N2 may be the first temporary delayed clock signal. A voltage signal of a third node N3 may be the second temporary delayed clock signal. A voltage signal of a fourth node N4 may be the third temporary delayed clock signal. A voltage signal of a seventh node N7 may be the first delay signal. A voltage signal of an eighth node N8 may be the second delay signal. A voltage signal of a ninth node N9 may be the third delay signal. A voltage signal of a tenth node N10 may be the first delayed clock signal. A voltage signal of an eleventh node N11 may be the first inverted clock signal.

An input terminal of the first buffer 141 is electrically connected to the first node N1. An output terminal of the first buffer 141 is electrically connected to the second node N2. A first input terminal of the first AND gate 142 is electrically connected to the second node N2. A second input terminal of the first AND gate 142 is electrically connected to the seventh node N7. An output terminal of the first AND gate 142 is electrically connected to an input terminal of the second buffer 143. An output terminal of the second buffer 143 is electrically connected to the third node N3. A first input terminal of the second AND gate 144 is electrically connected to the third node N3. A second input terminal of the second AND gate 144 is electrically connected to the eighth node N8. An output terminal of the second AND gate 144 is electrically connected to an input terminal of the third buffer 145. An output terminal of the third buffer 145 is electrically connected to the fourth node N4.

An input terminal D1 of the first D flip-flop 151 is electrically connected to the first node N1. A clock terminal of the first D flip-flop 151 is electrically connected to the second node N2. An output terminal QP1 of the first D flip-flop 151 is electrically connected to the fifth node N5. An input terminal D2 of the second D flip-flop 152 is electrically connected to the first node N1. A clock terminal of the second D flip-flop 152 is electrically connected to the third node N3. An output terminal QP2 of the second D flip-flop 152 is electrically connected to the sixth node N6. An input terminal D3 of the third D flip-flop 153 is electrically connected to the first node N1. A clock terminal of the third D flip-flop 153 is electrically connected to the fourth node N4. An output terminal QP3 of the third D flip-flop 153 is electrically connected to a second input terminal IN32 of the third detection unit 156.

An input terminal IN11 of the first detection unit 154 is electrically connected to the fifth node N5. A first input terminal IN21 of the second detection unit 155 is electrically connected to the fifth node N5. A second input terminal IN22 of the second detection unit 155 is electrically connected to the sixth node N6. A first input terminal of the third detection unit 156 is electrically connected to the sixth node N6. The second input terminal IN32 of the third detection unit 156 is electrically connected to the output terminal QP3 of the third D flip-flop 153. An output terminal ZP1 of the first detection unit 154 is electrically connected to the seventh node N7. An output node ZP2 of the second detection unit 155 is electrically connected to the eighth node N8. An output node ZP3 of the third detection unit 156 is electrically connected to the ninth node N9.

The first pass transistor PT1 electrically connects the second node N2 and the tenth node N10 based on a voltage signal of the seventh node N7. In an example embodiment, the first pass transistor PT1 may electrically disconnect the second node N2 and the tenth node N10 when the voltage signal of the seventh node N7 has a logic high level, and the first pass transistor PT1 may electrically connect the second node N2 and the tenth node N10 when the voltage signal of the seventh node N7 has a logic low level.

The second pass transistor PT2 electrically connects the third node N3 and the tenth node N10 based on a voltage signal of the eighth node N8. In an example embodiment, the second pass transistor PT2 may electrically disconnect the third node N3 and the tenth node N10 when the voltage signal of the eighth node N8 has a logic high level, and the second pass transistor PT2 may electrically connect the third node N3 and the tenth node N10 when the voltage signal of the eighth node N8 has a logic low level.

The third pass transistor PT3 electrically connects the fourth node N4 and the tenth node N10 based on a voltage signal of the ninth node N9. In an example embodiment, the third pass transistor PT3 may electrically disconnect the fourth node N4 and the tenth node N10 when the voltage signal of the ninth node N9 has a logic high level, and the third pass transistor PT3 may electrically connect the fourth node N4 and the tenth node N10 when the voltage signal of the ninth node N9 has a logic low level.

An input terminal of the first inverter 146 is electrically connected to the tenth node N10. An output terminal of the first inverter 146 is electrically connected to the eleventh node N11.

The first detection unit 154 will be described with reference to FIG. 4. The second detection unit 155 will be described with reference to FIG. 5. The first pass transistor PT1 will be described with reference to FIG. 6, and an operation of the signals of the edge detector 140 will be described with the reference to FIGS. 7 through 9.

Figure 4:
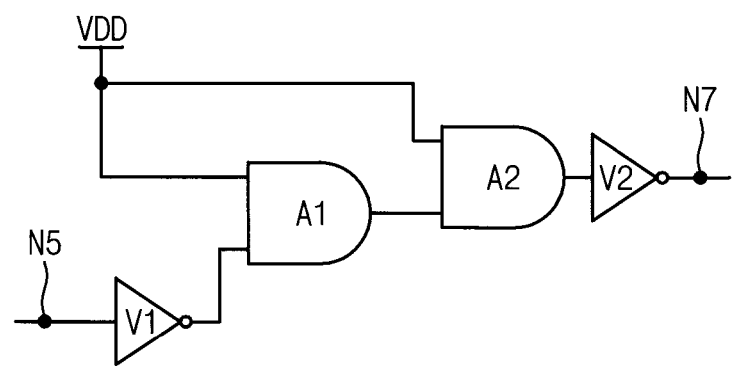
FIG. 4. is a circuit diagram illustrating an example first detection unit included in the edge detector of FIG. 3.

FIG. 4. is a circuit diagram illustrating an example of the first detection unit included in the edge detector of FIG. 3. Referring to FIG. 4, the first detection unit 154 may include a first AND gate A1, a second AND gate A2, a first inverter V1, and a second inverter V2. An input terminal of the first inverter V1 is electrically connected to the fifth node N5. An output terminal of the first inverter V1 is electrically connected to a second input terminal of the first AND gate A1. A first input terminal of the first AND gate A1 receives the supply voltage VDD representing a logic high level. A first input terminal of the second AND gate A2 receives the supply voltage representing a logic high level. A second input terminal of the second AND gate A2 is electrically connected to an output terminal of the first AND gate A1. An output terminal of the second AND gate A2 is electrically connected to an input terminal of the second inverter V2. An output terminal of the second inverter V2 is electrically connected to the seventh node N7.

Figure 5:
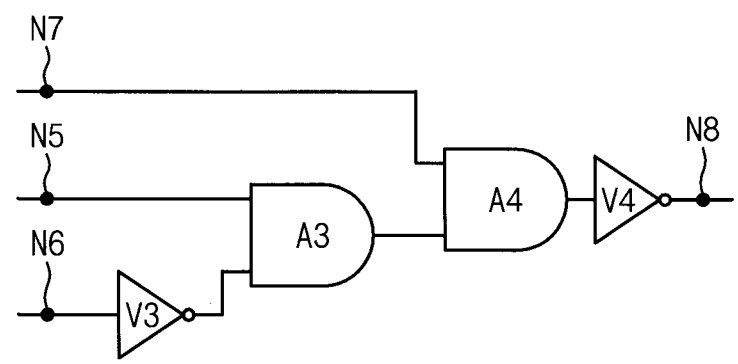
FIG. 5 is a circuit diagram illustrating an example second detection unit included in the edge detector of FIG. 3.

FIG. 5 is a circuit diagram illustrating an example of the second detection unit included in the edge detector of FIG. 3. The third detection unit 156 included in the edge detector 140 may have the same structure as the second detection unit 155.

Referring to FIG. 5, the second detection unit 155 may include a third AND gate A3, a fourth AND gate A4, a third inverter V3, and a fourth inverter V4. An input terminal of the third inverter V3 is electrically connected to the sixth node N6. An output terminal of the third inverter V3 is electrically connected to a second input terminal of the third AND gate A3. A first input terminal of the third AND gate A3 is electrically connected to the fifth node N5. An output terminal of the third AND gate A3 is electrically connected to a second input terminal of the fourth AND gate A4. A first input terminal of the fourth AND gate A4 is electrically connected to the seventh node N7. An output terminal of the fourth AND gate A4 is electrically connected to an input terminal of the fourth inverter V4. An output terminal of the fourth inverter V4 is electrically connected to the eighth node N8.

Figure 6:
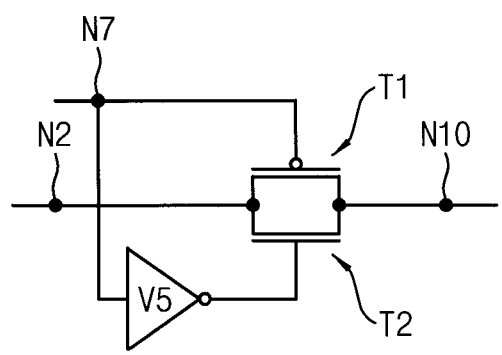
FIG. 6 is a circuit diagram illustrating an example first pass transistor included in the edge detector of FIG. 3.

FIG. 6 is a circuit diagram illustrating an example of the first pass transistor included in the edge detector of FIG. 3. The second pass transistor PT2 and the third pass transistor PT3 included in the edge detector 140 of FIG. 3 may have the same structure as the first pass transistor PT1.

Referring to FIG. 6, the first pass transistor PT1 may include a PMOS transistor T1, an NMOS transistor T2, and a fifth inverter V5. An input terminal of the fifth inverter V5 is electrically connected to the seventh node N7. A source terminal of the PMOS transistor T1 is electrically connected to the second node N2. A gate terminal of the PMOS transistor T1 is electrically connected to the seventh node N7. A drain terminal of the PMOS transistor T1 is electrically connected to the tenth node N10. A source terminal of the NMOS transistor T2 is electrically connected to the second node N2. A gate terminal of the NMOS transistor T2 is electrically connected to an output terminal of the fifth inverter V5. A drain terminal of the NMOS transistor N2 is electrically connected to the tenth node N10.

Figure 7:
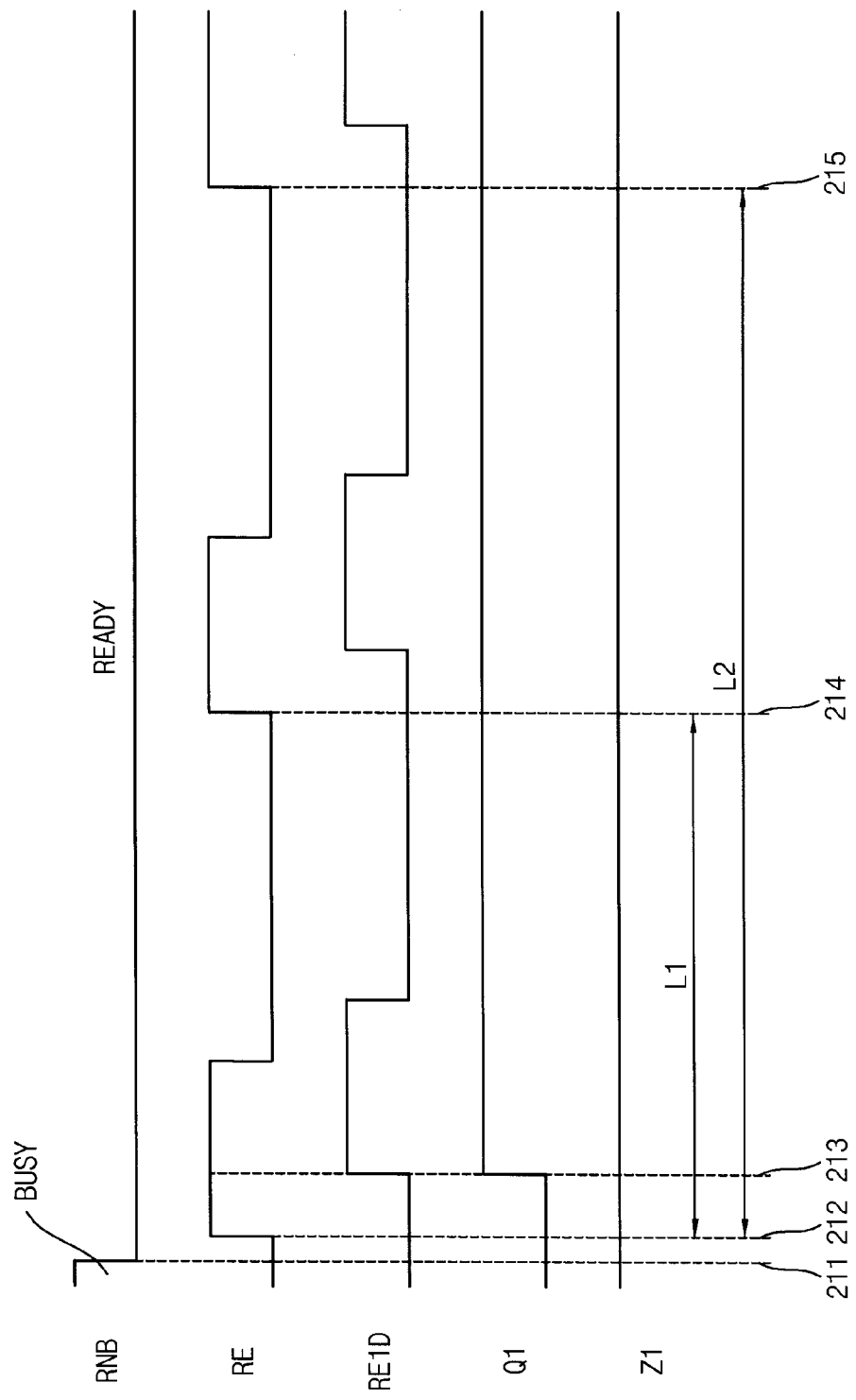
FIGS. 7 through 9 are timing diagrams illustrating operation of the processing unit included in the edge detector of FIG. 3.
Figure 8:
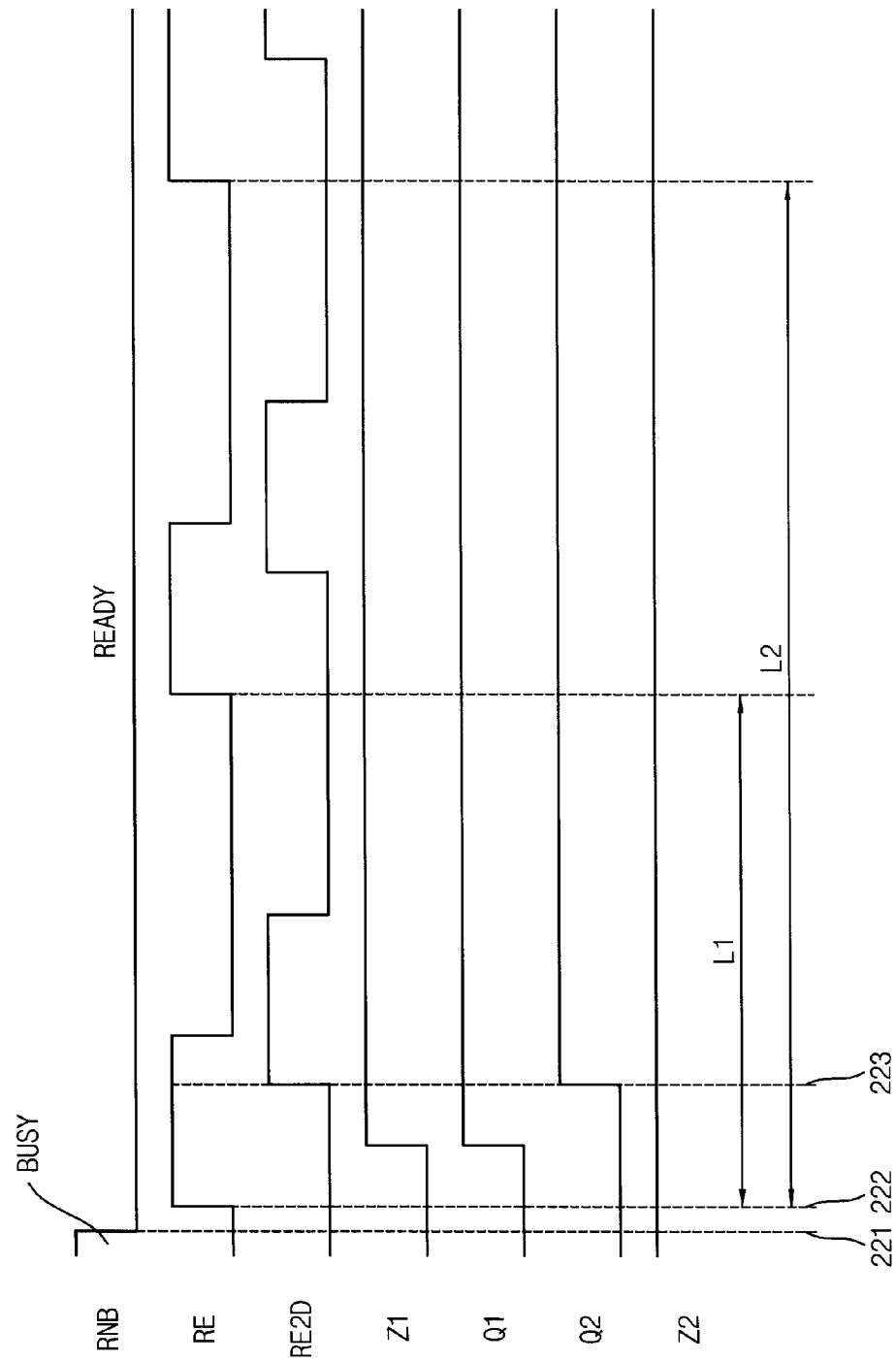
Figure 9:
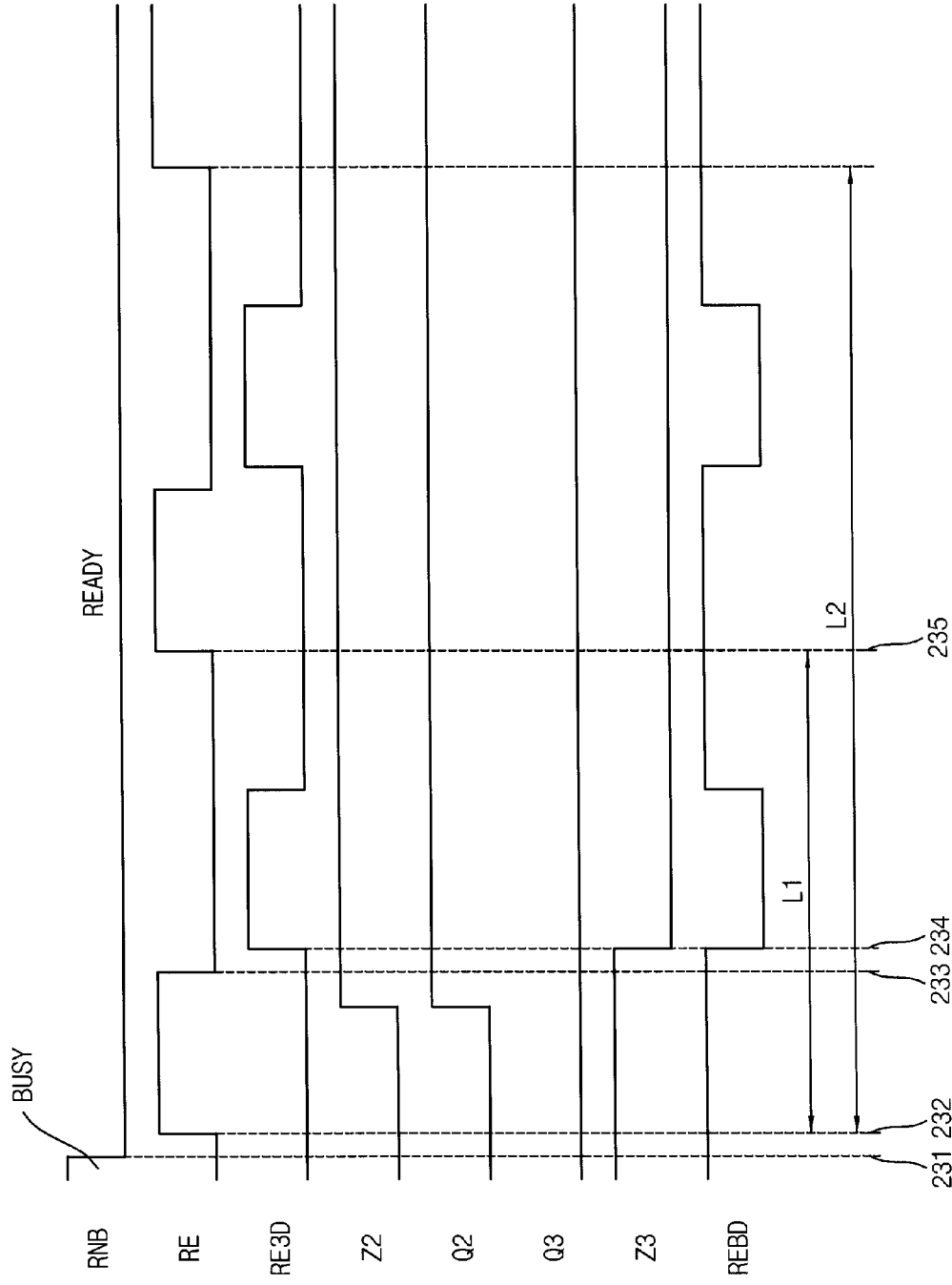

FIGS. 7 through 9 are timing diagrams illustrating the operation of the processing unit included in the edge detector of FIG. 3. Referring to FIG. 7, when the latency length signal NL is 1, the switch point calculator 130 may determine a first period 212~214 of the first clock signal RE after a first time point 211, when the use signal RB is deactivated, as the latency period. When the latency length signal NL is 2, the switch point calculator 130 may determine first and second periods 212~215 of the first clock signal RE after the first time point 211, when the use signal RB is deactivated, as the latency period. Latency periods L1, L2 of FIGS. 8 and 9 are the same as latency periods L1, L2 of FIG. 7, respectively.

The first delay unit DU1 generates the first delayed clock signal REID by delaying the first clock signal RE. The first D flip-flop 151 samples a logic high value of the first clock signal RE at a rising edge 213 of the first delayed clock signal REID, and stores the logic high value as a first output signal Q1. The first output signal Q1 is a voltage signal of the output terminal QP1 of the first D flip-flop 151. The first delay signal Z1 maintains a logic high level at the rising edge 213 of the first delayed clock signal REID. The first pass transistor PT1 electrically disconnects the second node N2 and the tenth node N10 based on the first delay signal Z1 having the logic high value.

Referring to FIG. 8, the second delay unit DU2 generates the second delayed clock signal RE2D by delaying the first delayed clock signal REID. The second D flip-flop 152 samples a logic high value of the first clock signal RE at a rising edge 223 of the second delayed clock signal RE2D, and stores the logic high value as a second output signal Q2. The second output signal Q2 is a voltage signal of the output terminal QP2 of the second D flip-flop 152. The second delay signal Z2 maintains the logic high level at the rising edge 223 of the second delayed clock signal RE2D. The second pass transistor PT2 electrically disconnects the third node n3 and the tenth node N10 based on the second delay signal Z2 having the logic high value.

Referring to FIG. 9, the third delay unit DU3 generates the third delayed clock signal RE3D by delaying the second delayed clock signal RE2D. The third D flip-flop 153 samples a logic low value of the first clock signal RE at a rising edge 234 of the third delayed clock signal RE3D, and stores the logic low value as a third output signal Q3. The third output signal Q3 is a voltage signal of the output terminal QP3 of the third D flip-flop 153. The third delay signal Z3 is changed to a logic low level at the rising edge 234 of the third delayed clock signal RE3D. The third pass transistor PT3 electrically connects the fourth node n4 and the tenth node n10 based on the third delay signal Z3 having the logic low value. The first inverter 146 generates the first inverted clock signal REBD by inverting the third delayed clock signal RE3D from the rising edge 234 of the third delayed clock signal RE3D.

In the case of FIG. 9, a delay length 232~234 of the first clock signal RE is greater than a length 232~233 of the logic high level duration included in a period 232~235 of the first clock signal RE. If delays of the delay units DU1, DU2, and DU3 are extremely small, the delay length of the first clock signal RE may be similar with or equal to the length 232~233 of the logic high level duration included in the period 232~235 of the first clock signal RE.

In an example embodiment, the edge detector 140 and the phase interpolator 180 may start operating from the latency period L1, L2. In another example embodiment, the edge detector 140 may generate the delay signals ZSIG and store the delay signals ZSIG to the delay register 190 when a write command is provided to the non-volatile memory device before execution of the read command. The phase interpolator 180 may operate from the latency period L1, L2 based on the delay signals ZSIG stored in the delay register 190.

Figure 10:
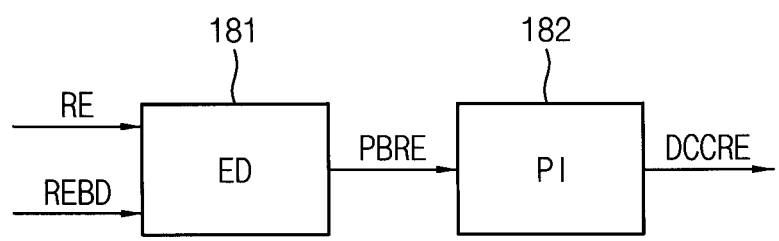
FIG. 10 is a block diagram illustrating an example phase interpolator included in the duty cycle corrector of FIG. 2.

FIG. 10 is a block diagram illustrating an example of the phase interpolator 180 included in the duty cycle corrector of FIG. 2. Referring to FIG. 10, the phase interpolator 180 may include a phase mixer ED 181 and a schmitt trigger circuit PI 182. The phase mixer 181 may generate a mixed clock signal PBRE by mixing the first clock signal RE and the first inverted clock signal REBD. The schmitt trigger circuit 182 generates the second clock signal DCCRE by clarifying a logic value characteristic of the mixed clock signal PBRE.

Figure 11:
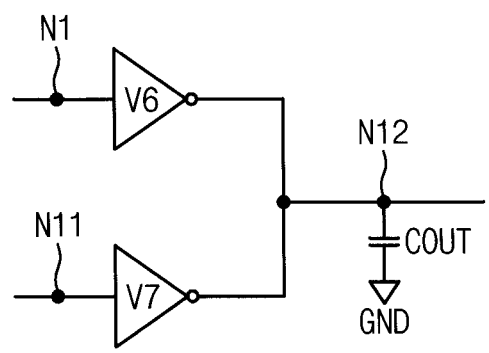
FIG. 11 is a block diagram illustrating an example phase mixer included in the phase interpolator of FIG. 10.

The phase mixer 181 will be described with reference to FIG. 11, and the schmitt trigger circuit 182 will be described with reference to FIG. 12. FIG. 11 is a block diagram illustrating an example of the phase mixer included in the phase interpolator of FIG. 10. Referring to FIG. 11, the phase mixer 181 includes a sixth inverter V6, a seventh inverter V7, and an output capacitor COUT.

An input terminal of the sixth inverter V6 is electrically connected to the first node N1. An output terminal of the sixth inverter V6 is electrically connected to the twelfth node N12. An input terminal of the seventh inverter V7 is electrically connected to the eleventh node N11. An output terminal of the seventh inverter V7 is electrically connected to the twelfth node N12. A terminal of the output capacitor COUT is electrically connected to the twelfth node N12. Another terminal of the output capacitor COUT receives the ground voltage GND.

A voltage signal of the first node N1 is the first clock signal RE. A voltage signal of the eleventh node N11 is the first inverted clock signal REBD. A voltage signal of the twelfth node N12 is the second clock signal DCCRE.

The sixth inverter V6 may charge or discharge the output capacitor COUT by driving the first clock signal RE. The seventh inverter V7 may charge or discharge the output capacitor COUT by driving the inverted clock signal REBD with the same driving power as the sixth inverter V6. As a result, the second clock signal DCCRE may be a mixed signal of the first clock signal RE and the first inverted clock signal REBD in a proportion 1:1.

In an example embodiment, the mixing ratio may be changed as n:1 (n is a positive integer) by controlling the driving power of the sixth inverter V6 and the driving power of the seventh inverter V7 differently.

Figure 12:
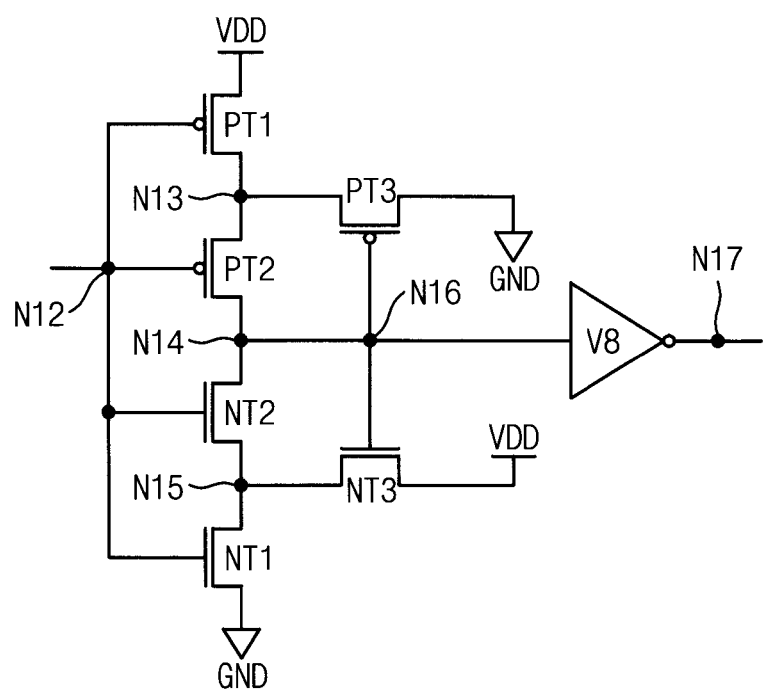
FIG. 12 is a circuit diagram illustrating an example Schmitt trigger circuit included in the phase interpolator of FIG. 10.

FIG. 12 is a circuit diagram illustrating an example of the Schmitt trigger circuit 182 included in the phase interpolator of FIG. 10. Referring to FIG. 12, the schmitt trigger circuit 182 includes a first PMOS transistor PT1, a second PMOS transistor PT2, a third PMOS transistor PT3, a first NMOS transistor NT1, a second NMOS transistor NT2, a third NMOS transistor NT3, and an eighth inverter V8.

A source terminal of the first PMOS transistor PT1 receives the supply voltage VDD. A gate terminal of the first PMOS transistor PT1 is electrically connected to the twelfth node N12. A drain terminal of the first PMOS transistor PT1 is electrically connected to the thirteenth node N13. A source terminal of the second PMOS transistor PT2 is connected to the thirteenth node N13. A gate terminal of the second PMOS transistor PT2 is connected to the twelfth node N12. A drain terminal of the second PMOS transistor PT2 is electrically connected to the fourteenth node N14. A source terminal of the third PMOS transistor PT3 is connected to the thirteenth node N13. A gate terminal of the third PMOS transistor PT3 is connected to the sixteenth node N16. A drain terminal of the third PMOS transistor PT3 receives the ground voltage GND.

A source terminal of the first NMOS transistor NT1 is electrically connected to the fifteenth node N15. A gate terminal of the first NMOS transistor NT1 is electrically connected to the twelfth node N12. A drain terminal of the first NMOS transistor NT1 receives the ground voltage GND. A source terminal of the second NMOS transistor NT2 is electrically connected to the fourteenth node N14. A gate terminal of the second NMOS transistor NT2 is electrically connected to the twelfth node N12. A drain terminal of the second NMOS transistor NT2 is electrically connected to the fifteenth node N15. A source terminal of the third NMOS transistor NT3 is electrically connected to the fifteenth node N15. A gate terminal of the third NMOS transistor NT3 is electrically connected to the sixteenth node N16. A drain terminal of the third NMOS transistor NT3 receives the supply voltage VDD.

An input terminal of the eighth inverter V8 is electrically connected to the sixteenth node N16. An output terminal of the eighth inverter V8 is electrically connected to the seventeenth node N17.

A voltage signal of the twelfth node N12 may be the mixed clock signal PBRE. A voltage signal of the seventeenth node N17 may be the second clock signal DCCRE.

The second clock signal DCCRE maintains a logic low level when the mixed clock signal PBRE is changed from the logic low level to a logic high level. When the voltage level of the mixed clock signal PBRE increases and becomes greater than a threshold voltage VthNT1 of the first NMOS transistor NT1, the first NMOS transistor NT1 is turned on, and the third NMOS transistor NT3 is turned on. If a turn-on resistance of the first NMOS transistor NT1 is RN1 and a turn-on resistance of the third NMOS transistor NT3 is RN3, a voltage of the fifteenth node N15 is VDD*(RN1/(RN1+RN3)). A first voltage (=VDD*(RN1/(RN1+RN3))+VthNT2), which is calculated by adding a voltage of the fifteenth node N15 and a threshold voltage VthNT2 of the second NMOS transistor NT2, should be applied to the gate terminal of the second NMOS transistor NT2 to turn on the second NMOS transistor NT2. The voltage level of the second clock signal DCCRE is changed to the logic high level when the voltage level of the mixed clock signal PBRE becomes greater than the first voltage.

The second clock signal DCCRE maintains a logic high level when the mixed clock signal PBRE is changed from the logic high level to a logic low level. When the voltage level of the mixed clock signal PBRE decreases and becomes smaller than a threshold voltage VthPT1 of the first PMOS transistor PT1, the first PMOS transistor PT1 is turned on, and the third PMOS transistor PT3 is turned on. If a turn-on resistance of the first PMOS transistor PT1 is RP1 and a turn-on resistance of the third PMOS transistor PT3 is RP3, a voltage of the thirteenth node N13 is VDD*(RP3/(RP1+RP3)). A second voltage (=VDD*(RP3/(RP1+RP3))−VthPT2), which is calculated by subtracting a threshold voltage VthPT2 of the second PMOS transistor PT2 from a voltage of the thirteenth node N13, should be applied to the gate terminal of the second PMOS transistor PT2 to turn on the second PMOS transistor PT2. The voltage level of the second clock signal DCCRE is changed to a logic low level when the voltage level of the mixed clock signal PBRE becomes smaller than the second voltage.

Figure 13:
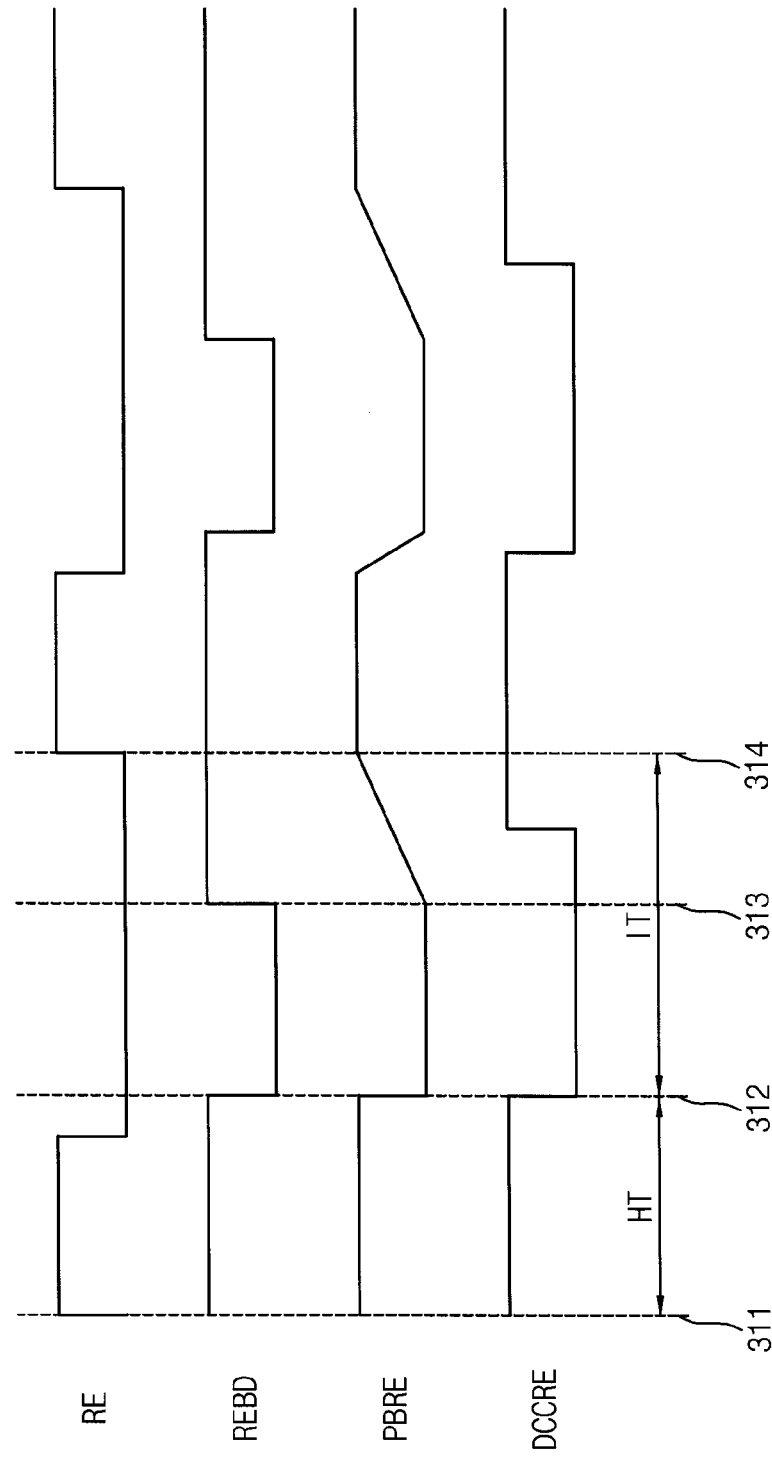
FIG. 13 is a timing diagram illustrating operation of the phase interpolator of FIG. 10.

FIG. 13 is a timing diagram illustrating operation of the phase interpolator of FIG. 10. Referring to FIG. 13, from a first time point 311 to a second time point 312, the edge detector 140 generates the first inverted clock signal REBD by delaying the first clock signal RE. Duration from the first time point 311 to the second time point 312 is referred as a half-edge detection time HT.

From the second time point 312 to a fourth time point 314, the phase mixer 181 of the phase interpolator 180 generates the mixed clock signal PBRE by mixing the first clock signal RE and the first inverted clock signal REBD. From the second time point 312 to the fourth time point 314, the schmitt trigger circuit 182 generates the second clock signal DCCRE by clarifying a logic value characteristic of the mixed clock signal PBRE. The duration from the second time point 312 to the fourth time point 314 is referred to as a phase interpolation time IT.

After the fourth time point 314, the phase mixer 181 and the schmitt trigger circuit 182 maintain the second clock signal DCCRE modified from the first time point 311 to the fourth time point 314. FIG. 13 shows that a duty cycle of the second clock signal DCCRE is 50% after the second time point 312.

Figure 14:
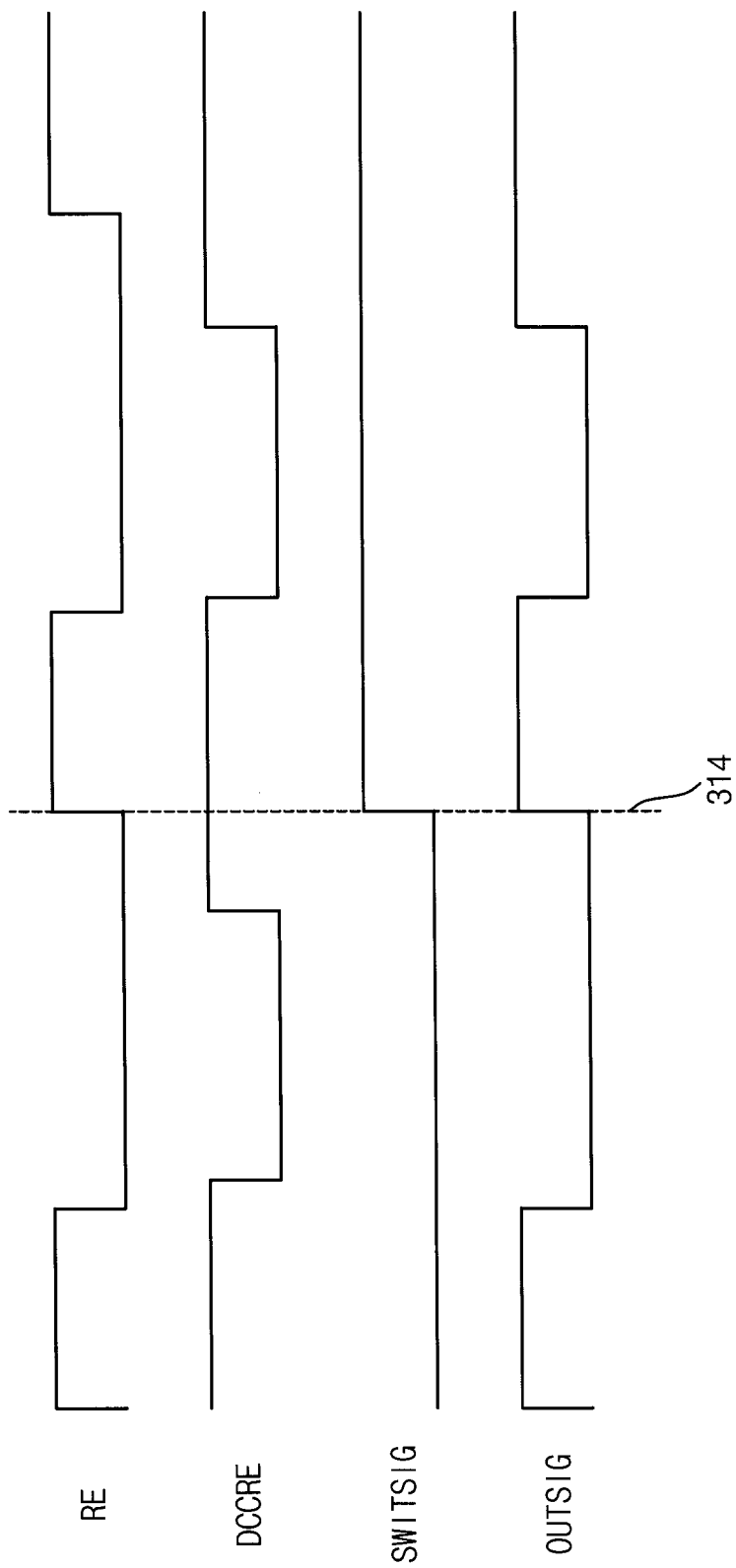
FIG. 14 is a timing diagram illustrating operation of the multiplexer included in the clock signal processor of FIG. 1.

FIG. 14 is a timing diagram illustrating operation of the multiplexer included in the clock signal processor of FIG. 1. Referring to FIG. 14, the switch point calculator 130 may activate the switch signal SWITSIG at the fourth time point 314 when the latency period ends. The multiplexer 120 outputs the first clock signal RE as the third clock signal OUTSIG before the fourth time point 314, and outputs the second clock signal DCCRE as the third clock signal OUTSIG after the fourth time point 314. The multiplexer 120 may change the third clock signal OUTSIG from the first clock signal RE to the second clock signal DCCRE continuously.

Figure 15:
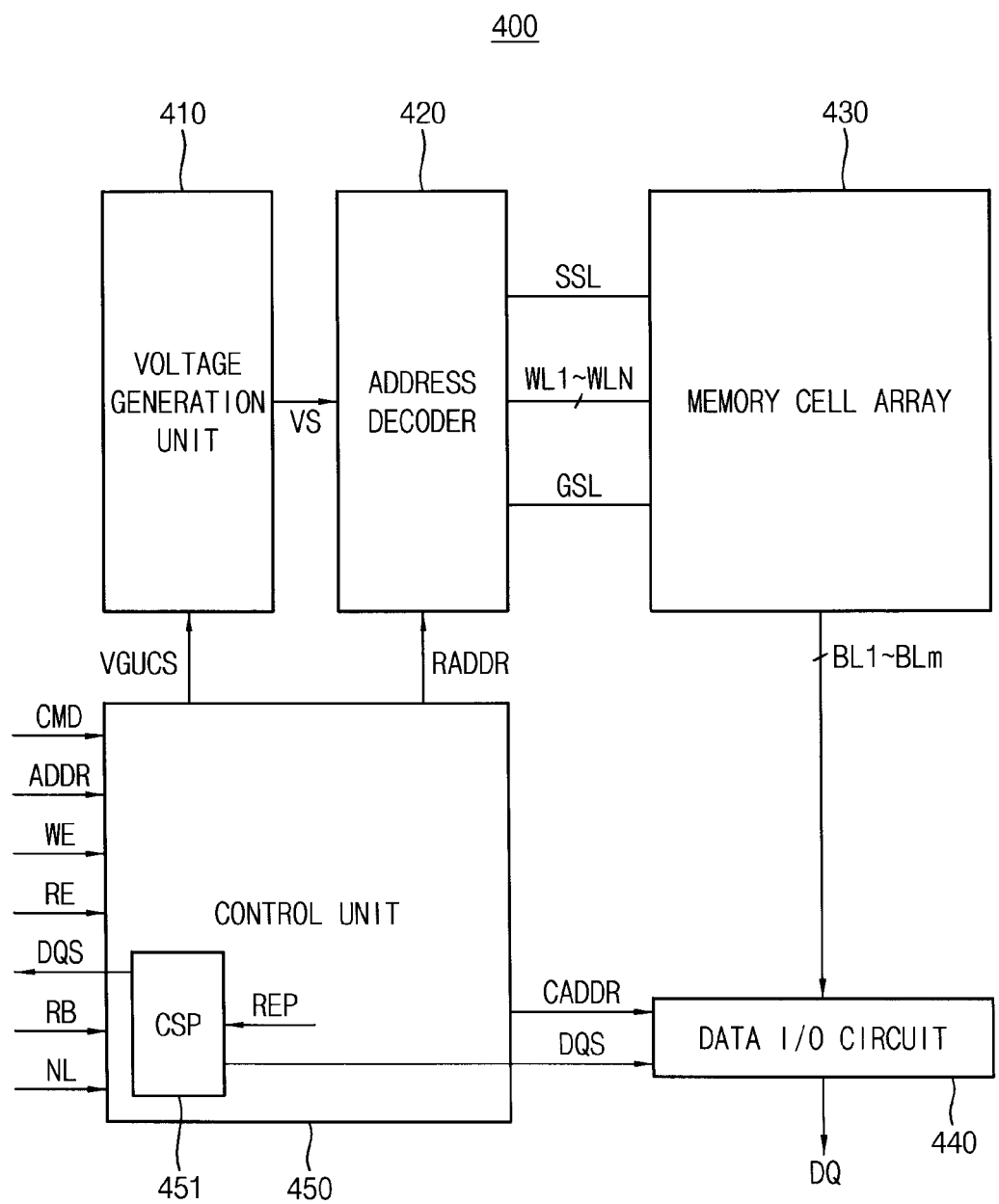
FIG. 15 is a block diagram illustrating an example non-volatile memory device including the clock signal processor of FIG. 1.

FIG. 15 is a block diagram illustrating a non-volatile memory device including the clock signal processor of FIG. 1. Referring to FIG. 15, a non-volatile memory device 400 includes a memory cell array 430, a control circuit 450, an address decoder 420, a voltage generation unit 410, and a data I/O circuit 440. The control circuit 450 includes a clock signal processor CSP 451.

The memory cell array 430 may include a plurality of memory cells. In an example embodiment, a memory cell included in the memory cell array 430 may be a single-level cell which stores a data bit. In another example embodiment, a memory cell included in the memory cell array 430 may be a multi-level cell which stores two bit data. In still another example embodiment, a memory cell included in the memory cell array 430 may be a triple-level cell which stores three bit data.

The control circuit 450 generates a row address signal RADDR and a column address signal CADDR based on a command signal CMD and an address signal ADDR. The control circuit 450 outputs a voltage generation unit control signal VGUCS which controls the voltage generation unit 410. The clock signal processor 451 generates a data strobe signal DQS based on a second read clock signal REP, which is changed from a first read clock signal RE during a read operation.

The voltage generation unit 410 generates a plurality of reference voltages VS based on the voltage generation unit control signal VGUCS. The address decoder 420 activates a word line, which corresponds to the row address signal RADDR, among the word lines WL1~WLn based on the reference voltage VS. The data I/O circuit 440 receives read data of memory cells connected to the word line through a plurality of bit lines BL1~BLm based on the column address signal CADDR, and outputs the read data as a data signal DQ. The clock signal processor 451 may have the same or similar structure with the clock signal processor 100 of FIG. 1.

Figure 16:
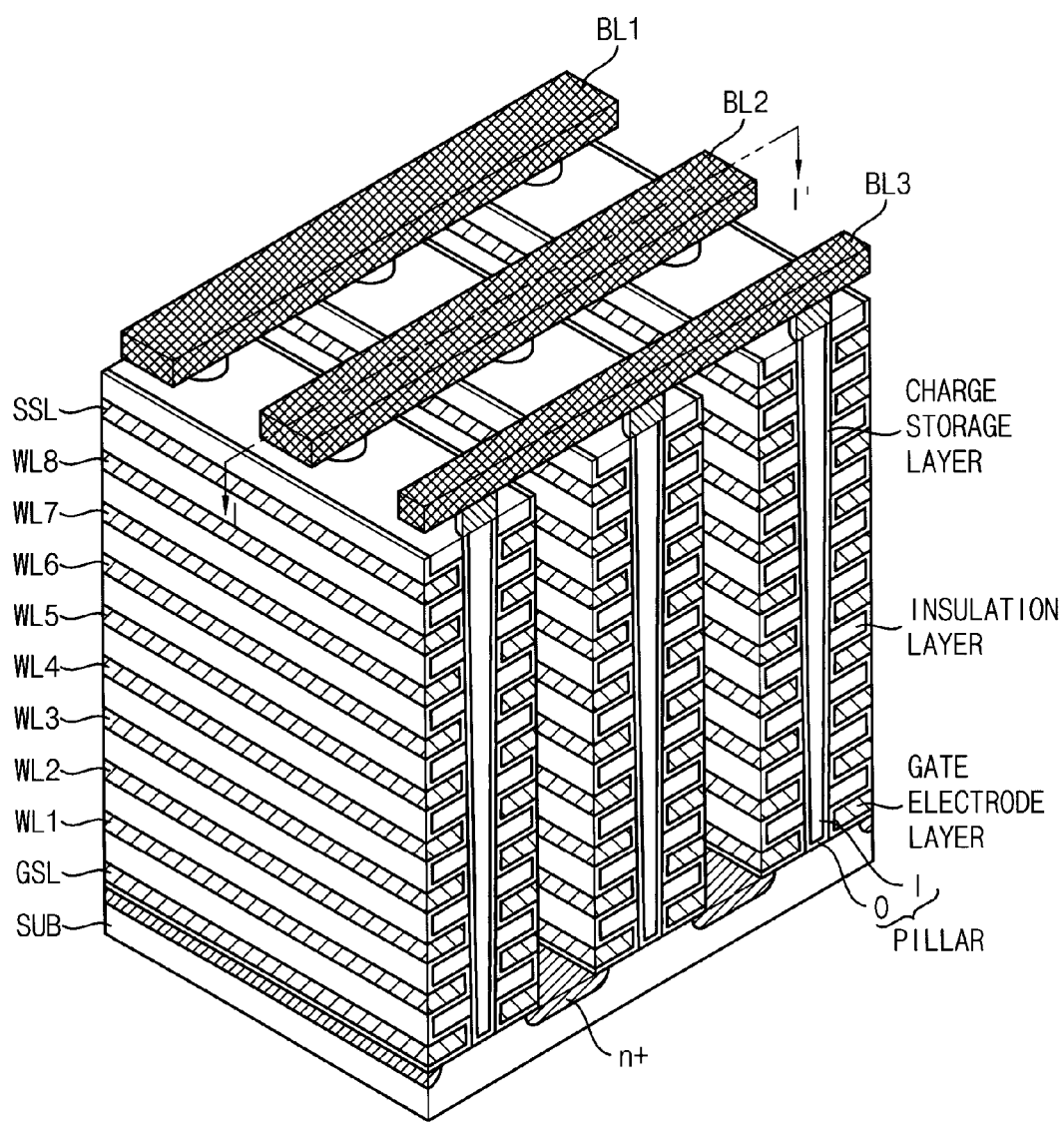
FIG. 16 is a perspective view illustrating a three-dimensional embodiment of the memory cell array included in the non-volatile memory device of FIG. 15.

FIG. 16 is a perspective view illustrating a three-dimensional embodiment of the memory cell array included in the non-volatile memory device of FIG. 15. Referring to FIG. 16, the memory cell array 430A may be formed in a direction perpendicular to a substrate SUB. An n+ doped region may be formed in the substrate SUB. A gate electrode layer and an insulation layer may be alternately deposited on the substrate SUB. Also, a charge storage layer may be formed between the gate electrode layer and the insulation layer.

When the gate electrode layer and the insulation layer are vertically patterned, a V-shaped pillar may be formed. The pillar may penetrate the gate electrode layer and the insulation layer to be connected to the substrate SUB. The outer portion O of the pillar may be configured with a channel semiconductor, and the inner portion I of the pillar may be configured with an insulation material such as silicon oxide.

The gate electrode layer may be connected to the ground selection line GSL, the plurality of word lines WL1~WL8, and the string selection line SSL. The pillar may be connected to the plurality of bit lines BL1~BL3.

It is illustrated in FIG. 16, that the memory cell array 430A has the ground selection line GSL, the string selection line SSL, eight wordlines WL1~WL8, and three bit lines BL1 to BL3 as an example, but embodiments are not limited thereto.

Figure 17:
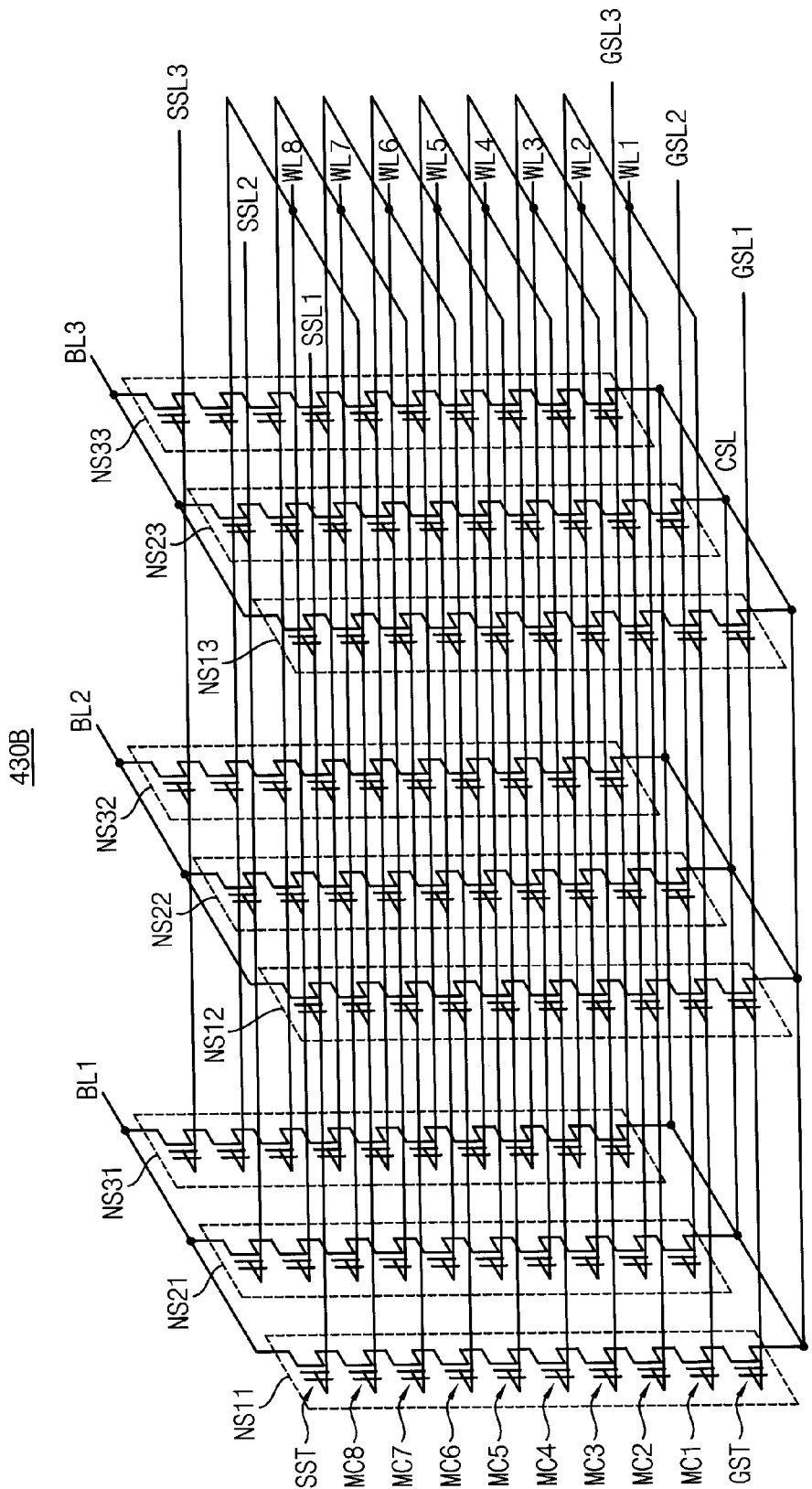
FIG. 17 is an equivalent circuit illustrating the memory cell array of FIG. 16.

FIG. 17 is an equivalent circuit illustrating the memory cell array of FIG. 16. Referring to FIG. 17, NAND strings NS11~NS33 may be connected between the bit lines BL1~BL3 and a common source line CSL. Each NAND string (e.g., NS11) may include a string selection transistor SST, a plurality of memory cells MC1~MC8, and a ground selection transistor GST.

The string selection transistor SST may be connected to string selection lines SSL1~SSL3. The plurality of memory cells MC1~MC8 may be connected to corresponding word lines WL1~WL8, respectively. The ground selection transistor GST may be connected to ground selection lines GSL1~GSL3. The string selection transistor SST may be connected to the bit lines BL1~BL3, and the ground selection transistor GST may be connected to the common source line CSL.

Referring again to FIG. 17, wordlines (e.g., WL1) having the same height may be commonly connected and the ground selection lines GSL1~GSL3 and the string selection lines SSL1~SSL3 may be separated. For example, when a physical page that includes memory cells connected to the first word line WL1 and included in the NAND strings NS11, NS12, and NS13 is programmed, the first word line WL1, the first string selection lines SSL1, and the first ground selection line GSL1 may be selected.

Figure 18:
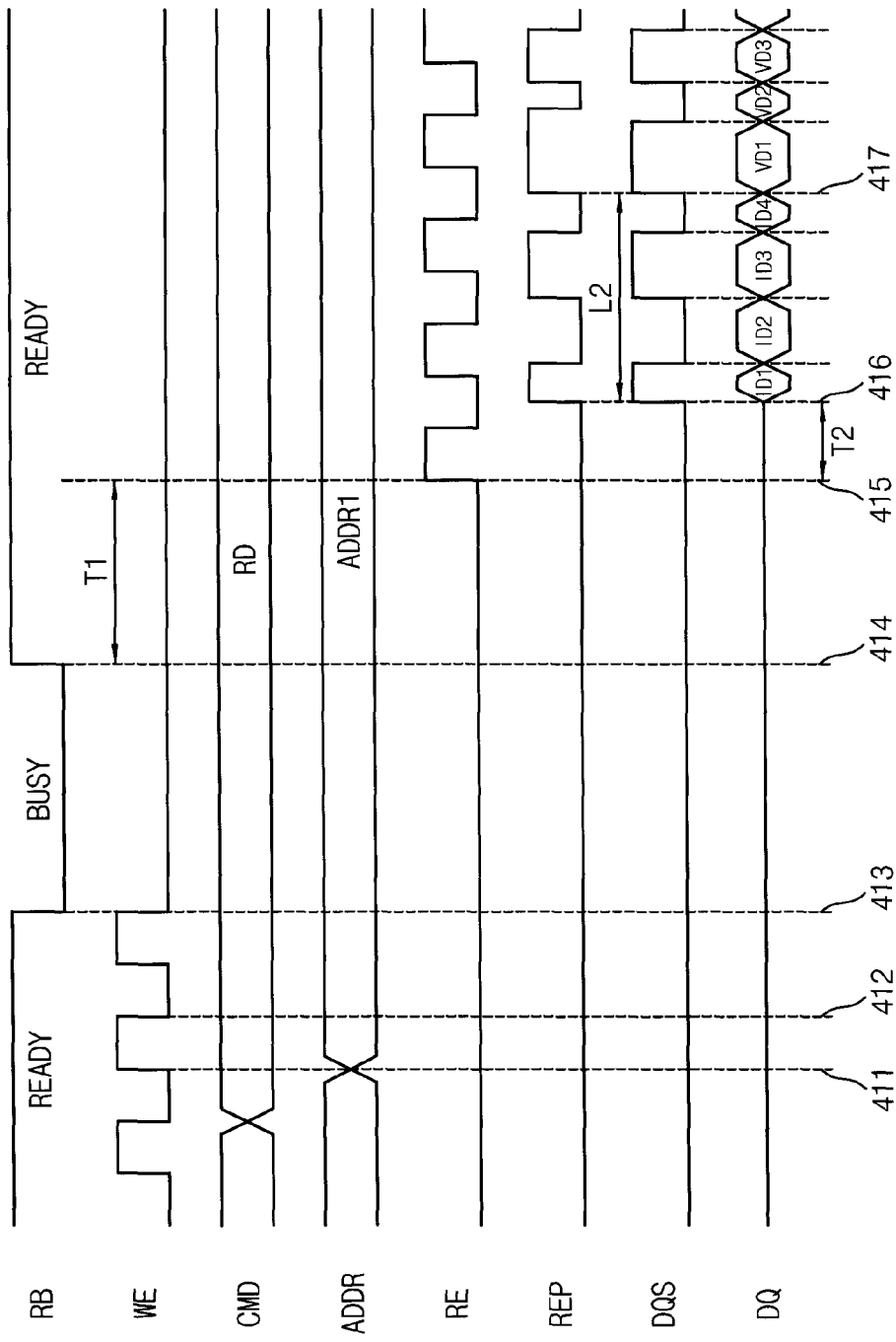
FIGS. 18 and 19 are timing diagrams illustrating operation of the non-volatile memory device of FIG. 15.
Figure 19:
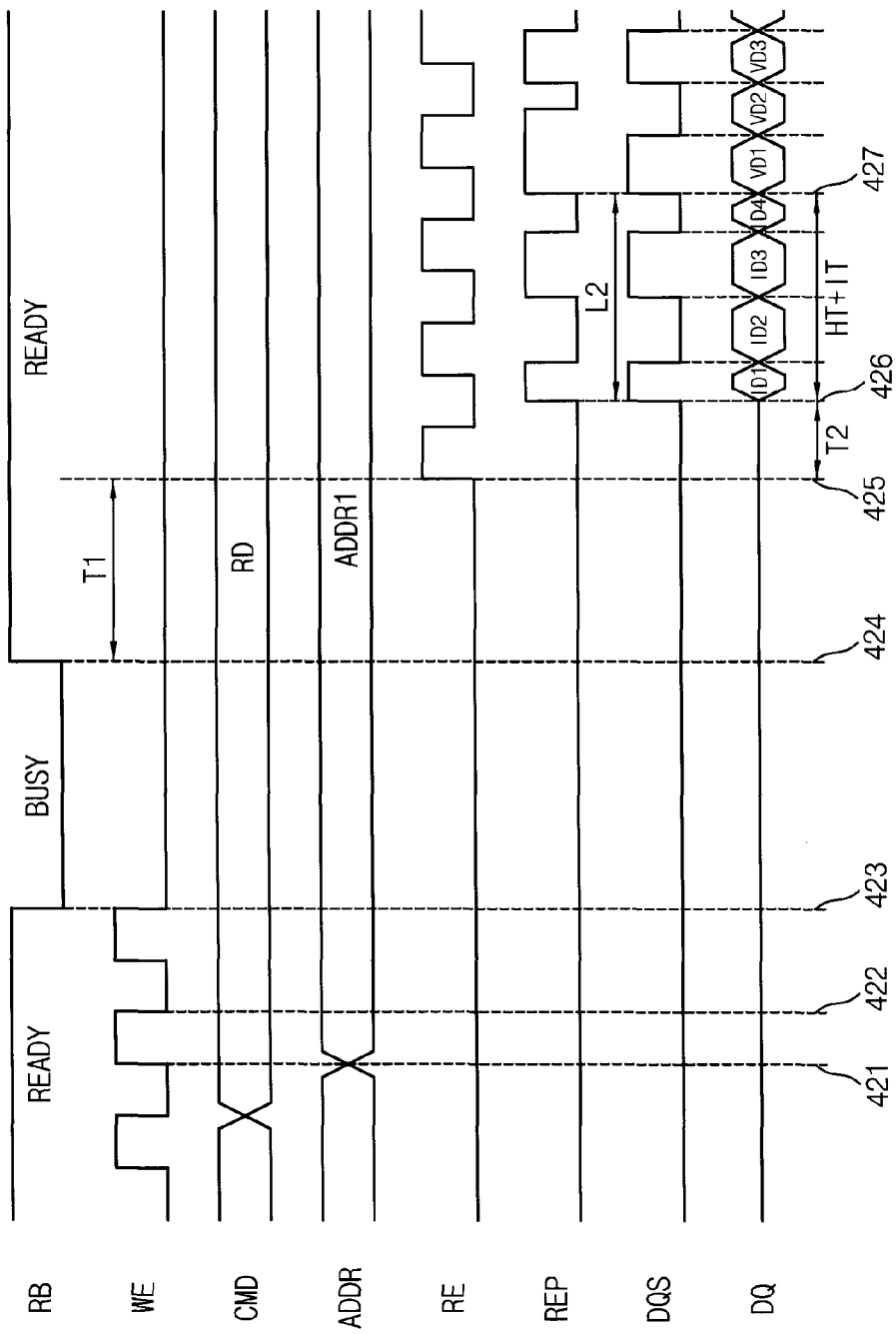

FIGS. 18 and 19 are timing diagrams illustrating operation of the non-volatile memory device of FIG. 15. FIG. 18 shows an operation of the non-volatile memory device 400 when the data strobe signal DQS is generated based on the second read clock signal REP without using the clock signal processor 451 and the latency length signal NL is 2. In this case, the latency period L2 corresponds to two periods of the second read clock signal REP.

The control circuit 450 receives the read command RD as the command signal CMD at a first time point 411, which is a rising edge of a write clock signal WE. The control circuit 450 receives a first address ADDR1 as the address signal ADDR at a second time point 412, which is a falling edge of the write clock signal WE.

From a third time point 413 to a fourth time point 414, memory cells corresponding to the first address ADDR1 execute a physical read operation and transfer read data to the data I/O circuit 440. The use signal RB is activated at the third time point 413, and deactivated at the fourth time point 414.

The data I/O circuit 440 generates the data signal DQ based on the read data during a first time T1, which is from the fourth time point 414 to a fifth time point 415.

The second read clock signal REP is delayed from the first read clock signal RE as much as a second time T2. A duty cycle of the second read clock signal REP is not 50%. Because the data I/O circuit 440 generates the data signal DQ based on the data strobe signal DQS, the duty cycle characteristic of the data signal DQ is not good.

FIG. 19 shows an operation of the non-volatile memory device 400 when the clock signal processor 451 generates the data strobe signal DQS based on the second read clock signal REP and the latency length signal NL is 2. The control circuit 450 receives the read command RD as the command signal CMD at a first time point 421, which is a rising edge of a write clock signal WE. The control circuit 450 receives a first address ADDR1 as the address signal ADDR at a second time point 422, which is a falling edge of the write clock signal WE.

From a third time point 423 to a fourth time point 424, memory cells corresponding to the first address ADDR1 execute a physical read operation and transfer read data to the data I/O circuit 440. The use signal RB is activated at the third time point 423, and deactivated at the fourth time point 424.

The data I/O circuit 440 generates the data signal DQ based on the read data during a first time T1, which is from the fourth time point 424 to a fifth time point 425.

The second read clock signal REP is delayed from the first read clock signal RE as much as a second time T2. A duty cycle of the second read clock signal REP is not 50%. The clock signal processor 451 may execute a duty cycle correction of the second read clock signal REP in the latency period L2. The latency period L2 includes a half-edge detection time HT of an edge detector included in the clock signal processor 451 and a phase interpolation time IT of a phase interpolator included in the clock signal processor 451. The clock signal processor 451 outputs the data strobe signal DQS having 50% duty cycle from the seventh time point 427. Because the data I/O circuit 440 generates the data signal DQ based on the data strobe signal DQS, the data signal DQ having 50% duty cycle is generated.

Figure 20:
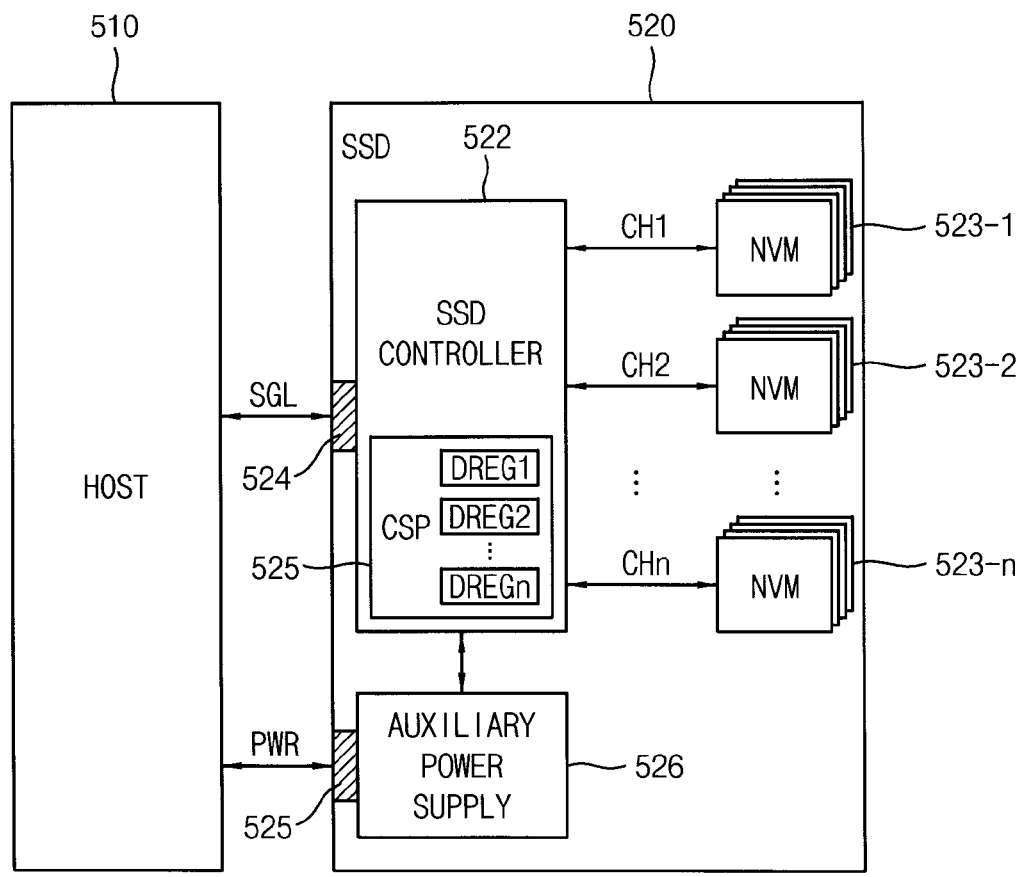
FIG. 20 is a block diagram illustrating a solid-state drive system according to an example embodiment.

FIG. 20 is a block diagram illustrating a solid-state drive system according to an example embodiment. Referring to FIG. 20, an SSD system 500 includes a host 510 and an SSD 520.

The SSD 520 includes first through n-th non-volatile memory devices 523-1, 523-2, . . . , 523-n and a SSD controller 522. Here, n represents an integer greater than or equal to two. The first through n-th non-volatile memory devices 523-1, 523-2, . . . , 523-n may be used as a storage medium of the SSD 520.

Each of the first through n-th non-volatile memory devices 523-1, 523-2, . . . , 523-n may include a memory cell array formed on a substrate in a three-dimensional (3D) structure. Memory cells included in the memory cell array may be formed in a direction perpendicular to the substrate. The memory cells included in the memory cell array may be connected to a plurality of word lines, which are stacked in a direction perpendicular to the substrate, and a plurality of bit lines, which are formed in a direction parallel to the substrate. The memory cell array having the three-dimensional structure may be understood based on reference to FIGS. 16 and 17.

The 3D memory cell array may be monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array. The following patent documents, which are hereby incorporated by reference, describe suitable example configurations for the 3D memory cell arrays, in which the three-dimensional memory cell array is configured as a plurality of levels, with word-lines and/or bit-lines shared between levels: U.S. Pat. Nos. 7,679,133; 8,553,466; 8,654,587; 8,559,235; and US Pat. Pub. No. 2011/0233648.

The SSD controller 522 may include a clock signal processor 525. The clock signal processor 525 may have the same or the similar structure with the clock signal processor 100 of FIG. 1. The clock signal processor 525 may include first through n-th delay registers DREG1, DREG2~DREGn which store the delay signals. The clock signal processor 525 may be understood based on reference to FIGS. 1 through 9.

The first delay register DREG1 may store the first delay signal corresponding to the first non-volatile memory device 523-1. The second delay register DREG2 may store the second delay signal corresponding to the second non-volatile memory device 523-2. The n-th delay register DREGn may store the n-th delay signal corresponding to the n-th non-volatile memory device 523-n.

In an example embodiment, an edge detector included in the clock signal processor 525 may generate the delay signals and store the delay signals to the delay registers DREG1, DREG2~DREGn when a write command is provided. In another example embodiment, the edge detector included in the clock signal processor 525 may generate the delay signal and store the delay signals to the delay registers DREG1, DREG2~DREGn within the latency period when a read command is provided.

The SSD controller 522 is coupled to the first through n-th non-volatile memory devices 523-1, 523-2, . . . , 523-n by first through n-th channels CH1, CH2, . . . , CHn, respectively. The SSD controller 522 may exchange a signal SGL with the host 510 through a signal connector 524. The signal SGL may include a command signal CMD, an address signal ADDR, a data strobe signal DQS, a data signal DQ, a read clock signal RE, a write clock signal WE, and a use signal RB. The SSD controller 522 may perform a program operation and a read operation on the first through n-th non-volatile memory devices 523-1, 523-2, . . . , 523-n according to the command received from the host 510.

When data is read from the first non-volatile memory device 523-1, the clock signal processor 525 may generate the data strobe signal DQS by modifying the duty cycle of the changed read clock signal based on the first delay signal stored in the first delay register DREG1. When data is read from the second non-volatile memory device 523-2, the clock signal processor 525 may generate the data strobe signal DQS by modifying the duty cycle of the changed read clock signal based on the second delay signal stored in the second delay register DREG2. When data is read from the n-th non-volatile memory device 523-n, the clock signal processor 525 may generate the data strobe signal DQS by modifying duty cycle of the changed read clock signal based on the n-th delay signal stored in the n-th delay register DREGn.

The SSD 520 may further include an auxiliary power supply 526. The auxiliary power supply 526 may receive power PWR from the host 510 through a power connector 525 and provide power to the SSD controller 522. The auxiliary power supply 526 may be placed inside or outside the SSD 520. For example, the auxiliary power supply 526 may be placed in a main board and provide auxiliary power to the SSD 520.

Figure 21:
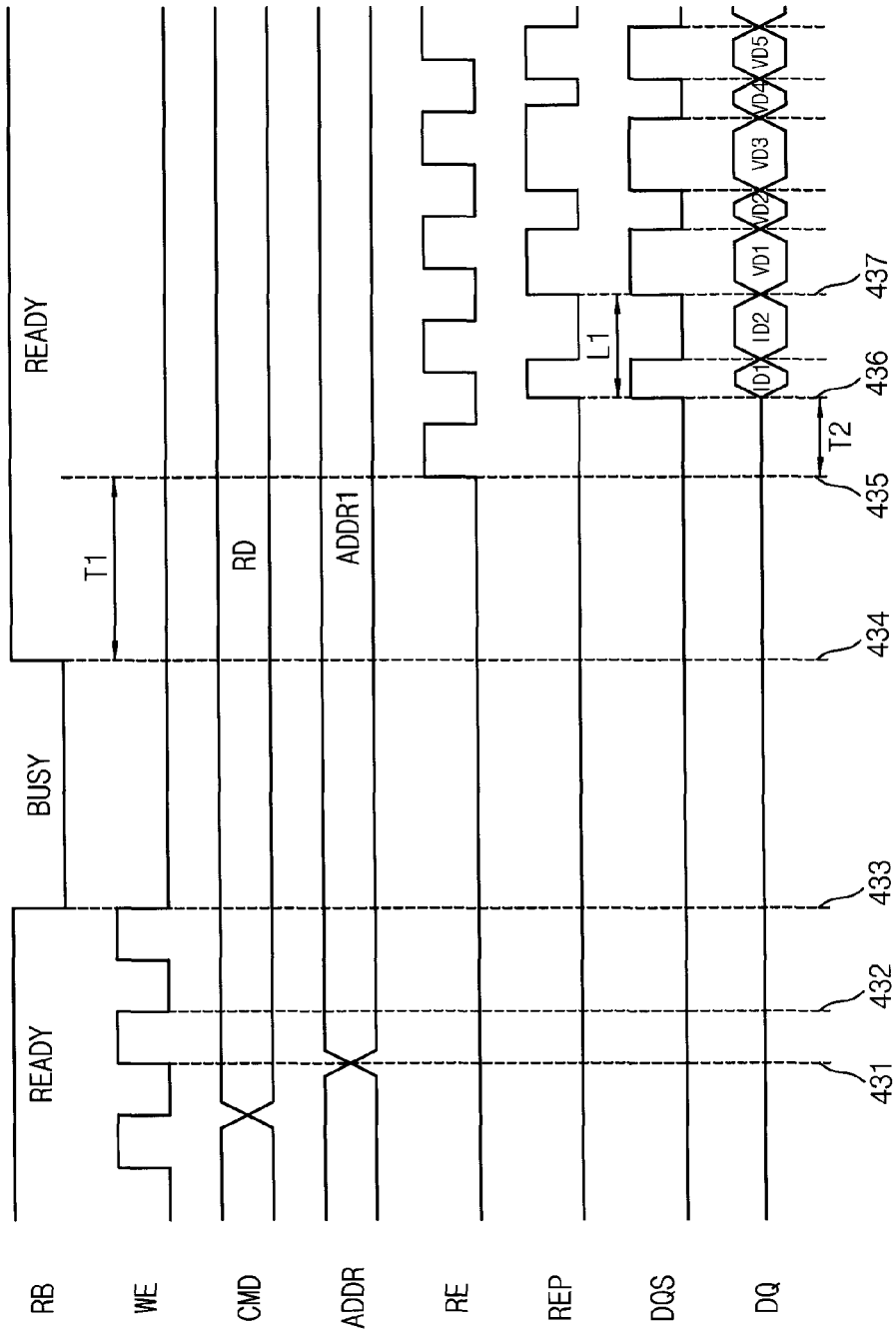
FIGS. 21 and 22 are timing diagrams illustrating operation of the solid-state drive system of FIG. 20.
Figure 22:
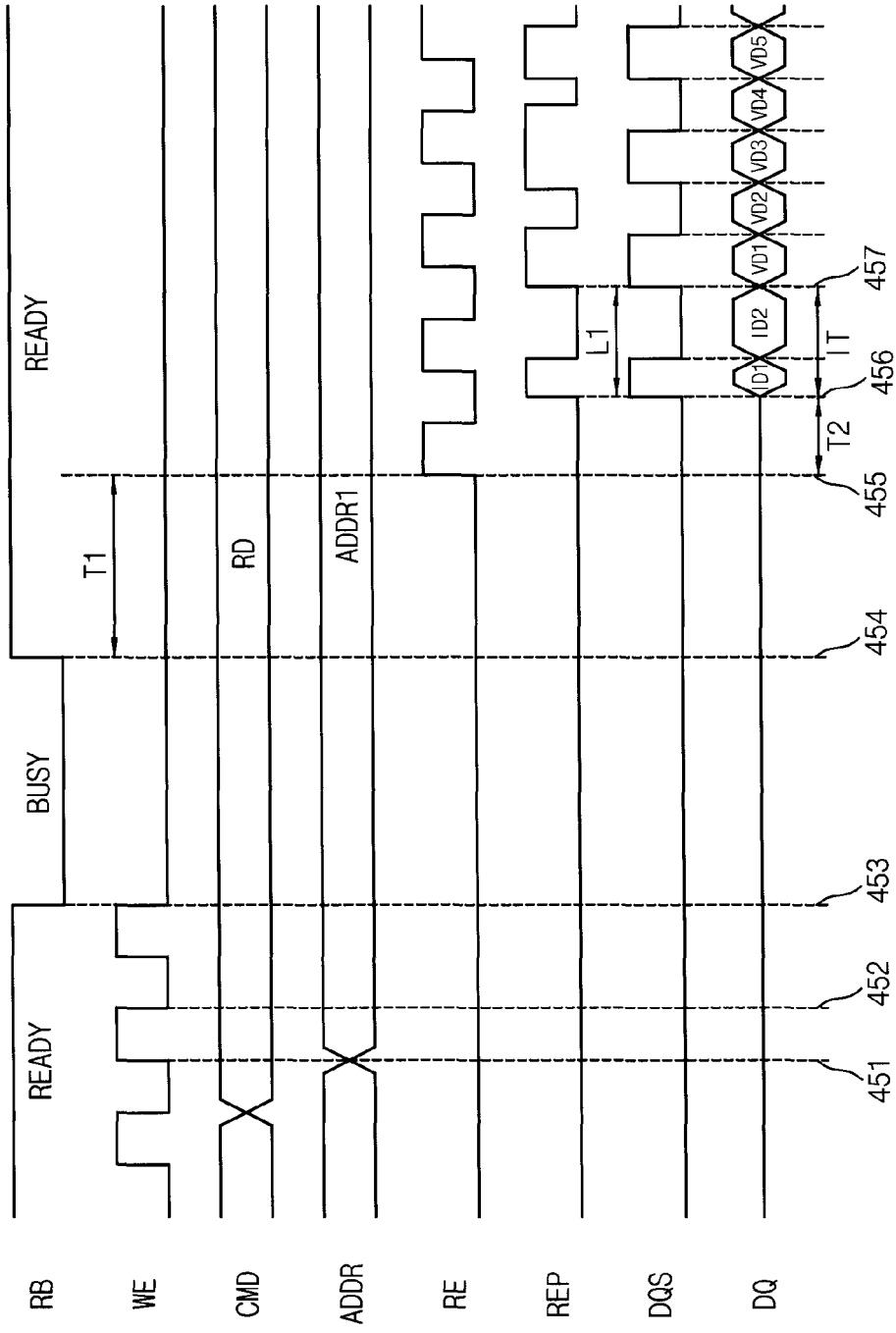

FIGS. 21 and 22 are timing diagrams illustrating operation of the solid-state drive system of FIG. 20. FIG. 21 shows an operation of the SSD system 500 when the data strobe signal DQS is generated based on the changed read clock signal REP without using the clock signal processor 525 and the latency length signal NL is 1. In this case, the latency period L1 corresponds to a period of the changed read clock signal REP. Other features of FIG. 21 may be understood based on reference to FIG. 18.

FIG. 22 shows an operation of the SSD system 500 when the clock signal processor 525 generates the data strobe signal DQS based on the changed read clock signal REP and the latency length signal NL has 1. Before a first time point 451, an edge detector included in the clock signal processor 525 generates the first delay signal of the first non-volatile memory device 523-1 corresponding to the first address ADDR1 and stores the first delay signal to the first delay register DREG1 when a write command corresponding to the first address ADDR1 is executed.

A phase interpolation time IT is included in the latency period L1. A phase interpolator included in the clock signal processor 525 executes a duty cycle correction of the changed read clock signal REP based on the pre-generated first delay signal in the phase interpolation time IT. Other features of FIG. 22 may be understood based on reference to FIG. 19.

Figure 23:
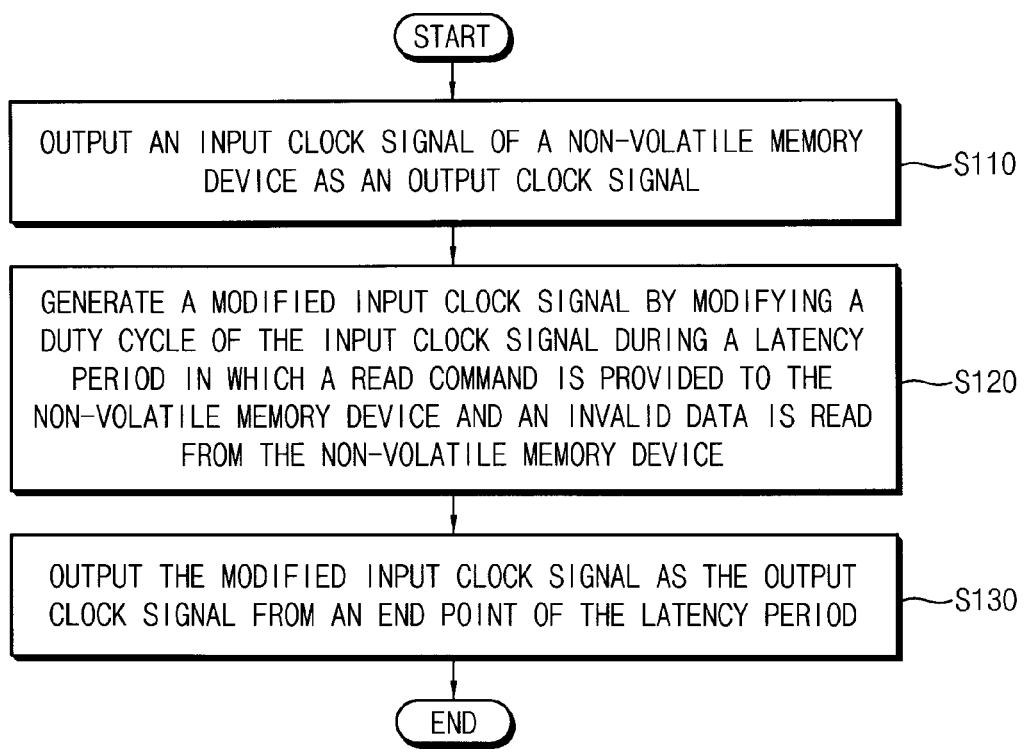
FIG. 23 is a flow chart illustrating a method of processing a clock according to an example embodiment.

FIG. 23 is a flow chart illustrating a method of processing a clock according to an example embodiment. Referring to FIG. 23, a method of processing a clock signal includes: outputting an input clock signal of a non-volatile memory device as an output clock signal (S110); generating a modified input clock signal by modifying a duty cycle of the input clock signal during a latency period in which a read command is provided to the non-volatile memory device and an invalid data is read from the non-volatile memory device (S120); and outputting the modified input clock signal as the output clock signal from an end point of the latency period (S130). The steps (S110, S120, and S130) may be understood based on reference to FIGS. 1 through 22.

Figure 24:
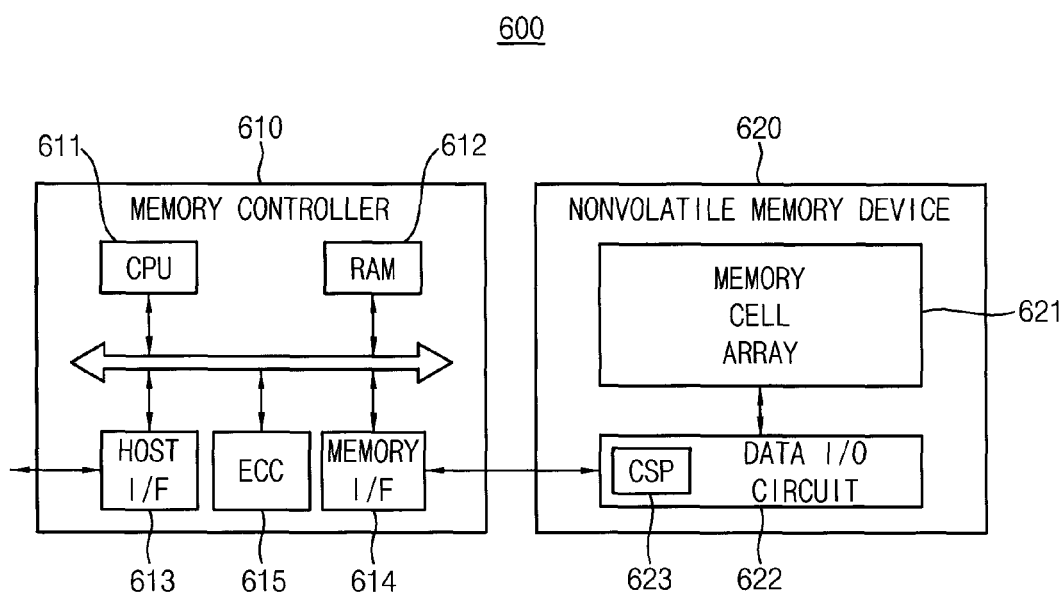
FIG. 24 is a block diagram illustrating a memory system according to an example embodiment.

FIG. 24 is a block diagram illustrating a memory system according to an example embodiment. Referring to FIG. 24, a memory system 600 includes a memory controller 610 and a non-volatile memory device 620. The non-volatile memory device 620 includes a memory cell array 621 and a data I/O circuit 622. The memory cell array 621 is formed on a substrate in a three-dimensional (3D) structure. The three-dimensional structure of the memory cell array 621 may be understood based on reference to FIGS. 16 and 17.

The 3D memory cell array may be monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array. The following patent documents, which are hereby incorporated by reference, describe suitable example configurations for the 3D memory cell arrays, in which the three-dimensional memory cell array is configured as a plurality of levels, with word-lines and/or bit-lines shared between levels: U.S. Pat. Nos. 7,679,133; 8,553,466; 8,654,587; 8,559,235; and US Pat. Pub. No. 2010/0233648.

The data I/O circuit 622 is connected to the memory cell array 621 through the plurality of bit lines. The data I/O circuit 622 may select at least one of the plurality of bit lines, output data read from a memory cell connected to the selected at least one bit line to the memory controller 610, and write data received from the memory controller 610 in a memory cell connected to the selected at least one bit line.

The data I/O circuit 622 may include a clock signal processor CSP 623. The clock signal processor 623 may have the same or the similar structure with the clock signal processor 100 of FIG. 1.

The memory controller 610 may control the non-volatile memory device 620. The memory controller 610 may control data transfer between an external host and the non-volatile memory device 620.

The memory controller 610 may include a central processing unit 611, a buffer memory 612, a host interface 613 and a memory interface 614.

The central processing unit 611 may perform operations for the data transfer. The buffer memory 612 may be implemented by a dynamic random access memory (DRAM), a static random access memory (SRAM), a phase change random access memory (PRAM), a ferroelectric random access memory (FRAM), a resistance random access memory (RRAM), a magnetic random access memory (MRAM), etc.

The buffer memory 612 may be an operational memory of the central processing unit 611. In some example embodiments, the buffer memory 612 may be included in the memory controller 610. In other example embodiments, the buffer memory 612 may be outside of the memory controller 610.

The host interface 613 may be coupled to the host, and the memory interface 614 may be coupled to the non-volatile memory device 620. The central processing unit 611 may communicate with the host via the host interface 613. For example, the host interface 613 may be configured to communicate with the host using at least one of various interface protocols, such as a universal serial bus (USB), a multimedia card (MMC), a peripheral component interconnect-express (PCI-E), a small computer system interface (SCSI), a serial-attached SCSI (SAS), a serial advanced technology attachment (SATA), a parallel advanced technology attachment (PATA), an enhanced small disk interface (ESDI), integrated drive electronics (IDE), and so on.

Further, the central processing unit 611 may communicate with the non-volatile memory device 620 via the memory interface 614.

In some example embodiments, the memory controller 610 may further include an error correction block 615 for error correction.

In some example embodiments, the memory controller 610 may be built in the non-volatile memory device 620, or the memory controller 610 and the non-volatile memory device 620 may be implemented as separate chips.

The memory system 600 may be implemented as a memory card, a solid state drive, and so on.

Figure 25:
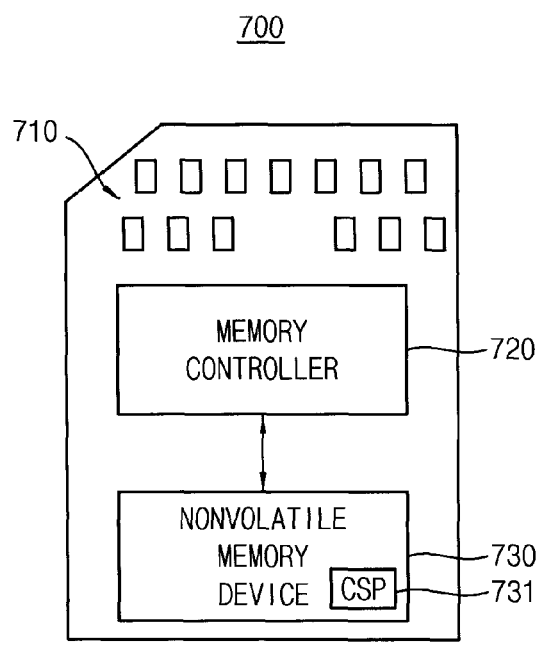
FIG. 25 is a block diagram illustrating a memory card according to an example embodiment.

FIG. 25 is a block diagram illustrating a memory card according to an example embodiment. Referring to FIG. 25, a memory card 700 includes a plurality of connecting pins 710, a memory controller 720 and a non-volatile memory device 730.

The connecting pins 710 may be coupled to an external host to transfer signals between the host and the memory card 700. The connecting pins 710 may include a clock pin, a command pin, a data pin and/or a reset pin.

The memory controller 720 may receive data from the host, and may store the received data in the non-volatile memory device 730.

The non-volatile memory device 730 may include a memory cell array formed on a substrate in a three-dimensional (3D) structure. Memory cells included in the memory cell array may be formed in a direction perpendicular to the substrate. The memory cells included in the memory cell array may be connected to a plurality of word lines, which are stacked in a direction perpendicular to the substrate, and a plurality of bit lines, which are formed in a direction parallel to the substrate. The memory cell array having the three-dimensional structure may be understood based on reference to FIGS. 16 and 17.

The 3D memory cell array may be monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array. The following patent documents, which are hereby incorporated by reference, describe suitable example configurations for the 3D memory cell arrays, in which the three-dimensional memory cell array is configured as a plurality of levels, with word-lines and/or bit-lines shared between levels: U.S. Pat. Nos. 7,679,133; 8,553,466; 8,654,587; 8,559,235; and US Pat. Pub. No. 2011/0233648.

The non-volatile memory device 730 may include a clock signal processor CSP 731. The clock signal processor 731 may have the same or the similar structure with the clock signal processor 100 of FIG. 1.

The memory card 700 may include an MMC, an embedded MMC (eMMC), a hybrid embedded MMC (hybrid eMMC), a secure digital (SD) card, a micro-SD card, a memory stick, an ID card, a personal computer memory card international association (PCMCIA) card, a chip card, a USB card, a smart card, a compact flash (CF) card, and so on.

In some example embodiments, the memory card 700 may be coupled to the host, such as a desktop computer, a laptop computer, a tablet computer, a mobile phone, a smart phone, a music player, a personal digital assistants (PDA), a portable multimedia player (PMP), a digital television, a digital camera, a portable game console, and so on.

Figure 26:
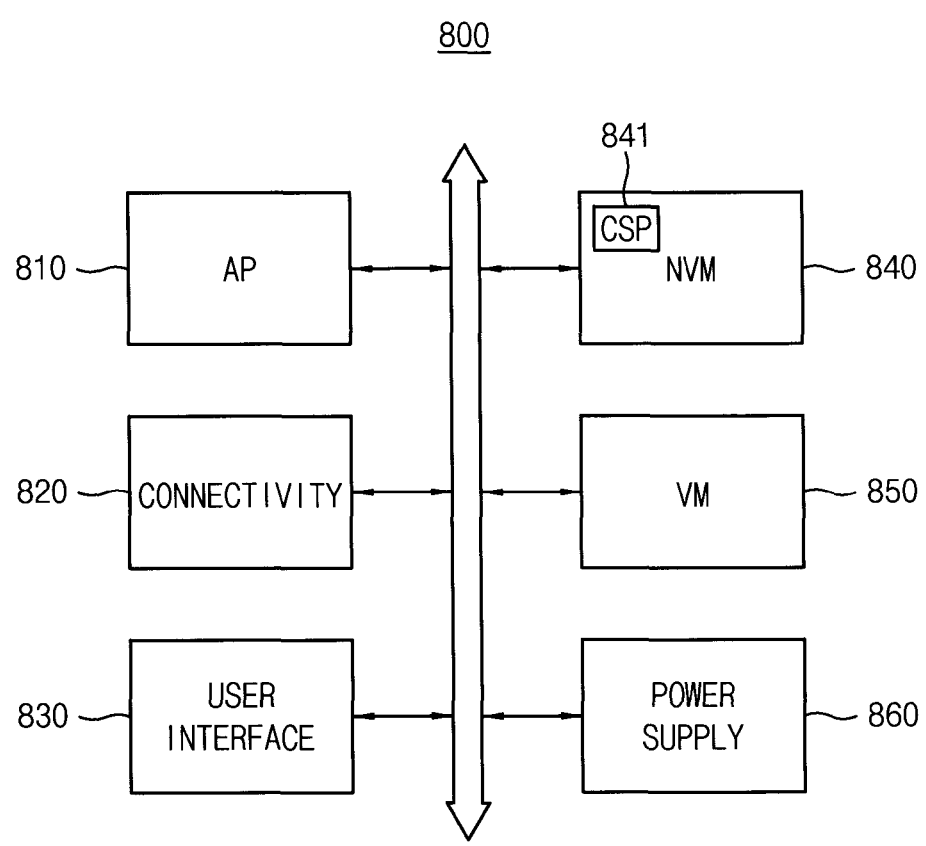
FIG. 26 is a block diagram illustrating a mobile system according to an example embodiment.

FIG. 26 is a block diagram illustrating a mobile system according to an example embodiment. Referring to FIG. 26, a mobile system 800 includes an application processor AP 810, a connectivity unit 820, a user interface 830, a non-volatile memory device NVM 840, a volatile memory device VM 850 and a power supply 860.

In some embodiments, the mobile system 800 may be a mobile phone, a smart phone, a personal digital assistant (PDA), a portable multimedia player (PMP), a digital camera, a music player, a portable game console, a navigation system, etc.

The application processor 810 may execute applications, such as a web browser, a game application, a video player, etc. In some example embodiments, the application processor 810 may include a single core or multiple cores. For example, the application processor 810 may be a multi-core processor, such as a dual-core processor, a quad-core processor, a hexa-core processor, etc. The application processor 810 may include an internal or external cache memory.

The connectivity unit 820 may perform wired or wireless communication with an external device. For example, the connectivity unit 820 may perform Ethernet communication, near field communication (NFC), radio frequency identification (RFID) communication, mobile telecommunication, memory card communication, universal serial bus (USB) communication, etc. In some embodiments, the connectivity unit 820 may include a baseband chipset that supports communications, such as global system for mobile communications (GSM), general packet radio service (GPRS), wideband code division multiple access (WCDMA), high speed downlink/uplink packet access (HSxPA), etc.

The non-volatile memory device 840 may store a boot image for booting the mobile system 800.

The non-volatile memory device 840 may include a memory cell array formed on a substrate in a three-dimensional (3D) structure. Memory cells included in the memory cell array may be formed in a direction perpendicular to the substrate. The memory cells included in the memory cell array may be connected to a plurality of word lines, which are stacked in a direction perpendicular to the substrate, and a plurality of bit lines, which are formed in a direction parallel to the substrate. The memory cell array having the three-dimensional structure may be understood based on the references to FIGS. 16 and 17.

The 3D memory cell array may be monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array. The following patent documents, which are hereby incorporated by reference, describe suitable example configurations for the 3D memory cell arrays, in which the three-dimensional memory cell array is configured as a plurality of levels, with word-lines and/or bit-lines shared between levels: U.S. Pat. Nos. 7,679,133; 8,553,466; 8,654,587; 8,559,235; and US Pat. Pub. No. 2011/0233648.

The non-volatile memory device 840 may include a clock signal processor CSP 841. The clock signal processor 841 may have the same or the similar structure with the clock signal processor 100 of FIG. 1.

The volatile memory device 850 may store data processed by the application processor 810, or may operate as a working memory.

The user interface 830 may include at least one input device, such as a keypad, a touch screen, etc., and at least one output device, such as a speaker, a display device, etc.

The power supply 860 may supply a power supply voltage to the mobile system 800.

In some embodiments, the mobile system 800 may further include an image processor, and/or a storage device, such as a memory card, a solid state drive (SSD), a hard disk drive (HDD), a CD-ROM, etc.

In some embodiments, the mobile system 800 and/or components of the mobile system 800 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

Figure 27:
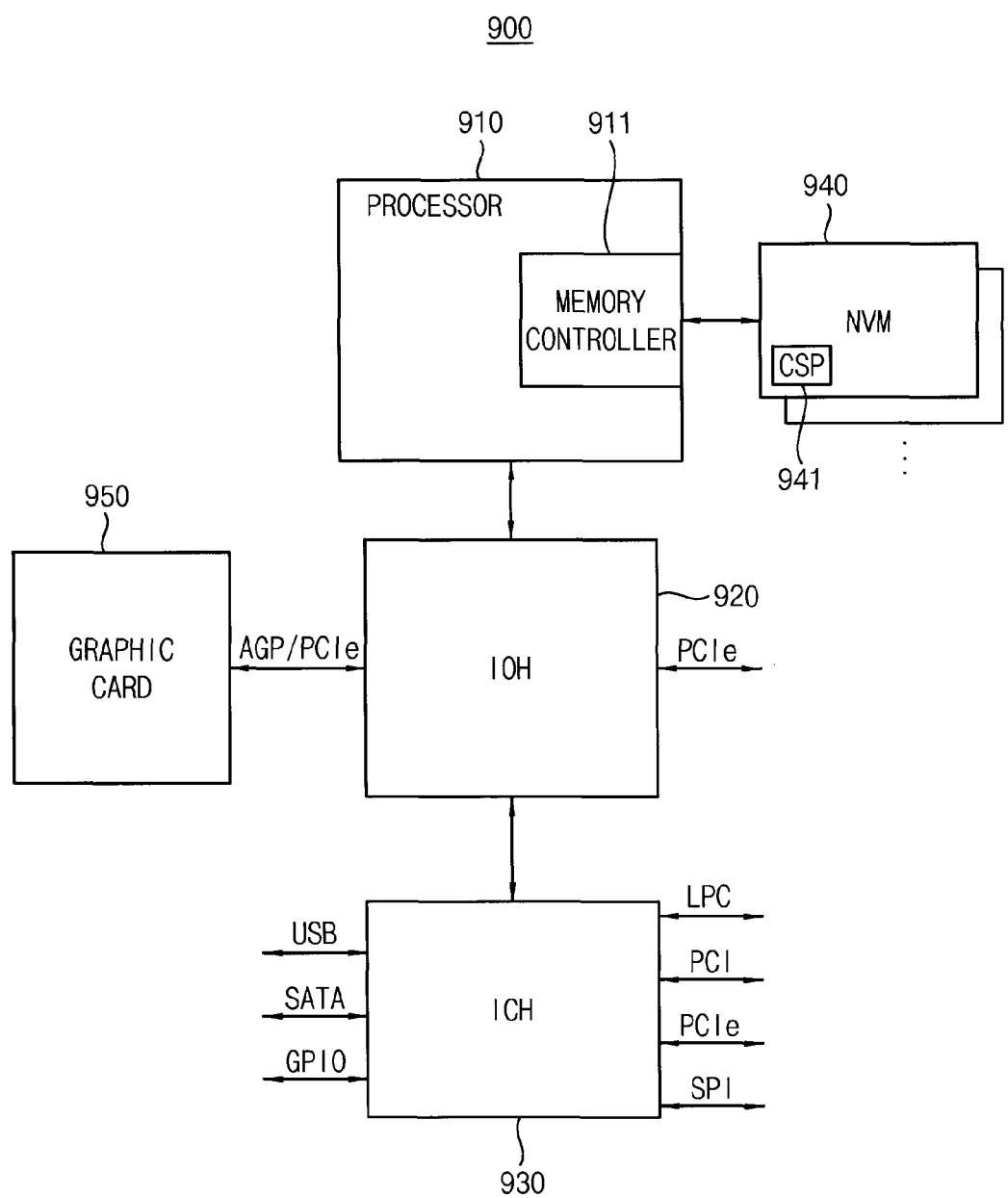
FIG. 27 is a block diagram illustrating a computing system including the clock signal processor according to an example embodiment.

FIG. 27 is a block diagram illustrating a computing system including the clock signal processor according to an example embodiment. Referring to FIG. 27, a computing system 900 includes a processor 910, an I/O hub 920, an I/O controller hub 930, at least one memory module 940 and a graphic card 950. According to example embodiments, the computing system 900 may be any computing system, such as a personal computer (PC), a server computer, a workstation, a tablet computer, a laptop computer, a mobile phone, a smart phone, a PDA, a PMP, a digital camera, a digital television, a set-top box, a music player, a portable game console, a navigation device, etc.

The processor 910 may perform specific calculations or tasks. For example, the processor 910 may be a microprocessor, a central process unit (CPU), a digital signal processor, or the like. According to example embodiments, the processor 910 may include a single processor core or a plurality of processor cores. For example, the processor 910 may be a multi-core processor, such as a dual-core processor, a quad-core processor, a hexa-core processor, etc. Although FIG. 27 illustrates an example of the computing system 900 including one processor 910, according to example embodiments, the computing system 900 may include a plurality of processors. In some example embodiments, the processor 910 may further include a cache memory located inside or outside the processor 910.

The processor 910 may include a memory controller 911 that controls an operation of the memory module 940. The memory controller 911 included in the processor 910 may be referred to as an integrated memory controller (IMC). A memory interface between the memory controller 911 and the memory module 940 may be implemented by one channel including a plurality of signal lines, or by a plurality of channels. Each channel may be coupled to at least one memory module 940. In some example embodiments, the memory controller 911 may be included in the I/O hub 920. The I/O hub 920 including the memory controller 911 may be referred to as a memory controller hub (MCH).

The non-volatile memory device 940 may include a memory cell array formed on a substrate in a three-dimensional (3D) structure. Memory cells included in the memory cell array may be formed in a direction perpendicular to the substrate. The memory cells included in the memory cell array may be connected to a plurality of word lines, which are stacked in a direction perpendicular to the substrate, and a plurality of bit lines, which are formed in a direction parallel to the substrate. The memory cell array having the three-dimensional structure may be understood based on reference to FIGS. 16 and 17.

The 3D memory cell array may be monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array. The following patent documents, which are hereby incorporated by reference, describe suitable example configurations for the 3D memory cell arrays, in which the three-dimensional memory cell array is configured as a plurality of levels, with word-lines and/or bit-lines shared between levels: U.S. Pat. Nos. 7,679,133; 8,553,466; 8,654,587; 8,559,235; and US Pat. Pub. No. 2011/0233648.

The non-volatile memory device 940 may include a clock signal processor CSP 941. The clock signal processor 941 may have the same or the similar structure with the clock signal processor 100 of FIG. 1.

The I/O hub 920 may manage data transfer between the processor 910 and devices, such as the graphic card 950. The I/O hub 920 may be coupled to the processor 910 via at least one of various interfaces, such as a front side bus (FSB), a system bus, a HyperTransport, a lightning data transport (LDT), a QuickPath interconnect (QPI), a common system interface (CSI), etc. Although FIG. 27 illustrates an example of the computing system 900 including one I/O hub 920, according to example embodiments, the computing system 900 may include a plurality of I/O hubs.

The I/O hub 920 may provide various interfaces with the devices. For example, the I/O hub 920 may provide an accelerated graphics port (AGP) interface, a peripheral component interface-express (PCIe), a communications streaming architecture (CSA) interface, etc.

The graphic card 950 may be coupled to the I/O hub 920 via the AGP or the PCIe. The graphic card 950 may control a display device (not illustrated) for displaying an image. The graphic card 950 may include an internal processor and an internal memory to process the image. In some example embodiments, the input/output hub 920 may include an internal graphic device along with or instead of the graphic card 950. The internal graphic device may be referred to as an integrated graphics, and an I/O hub including the memory controller and the internal graphic device may be referred to as a graphics and memory controller hub (GMCH).

The I/O controller hub 930 may perform data buffering and interface arbitration to efficiently operate various system interfaces. The I/O controller hub 930 may be coupled to the I/O hub 920 via an internal bus. For example, the I/O controller hub 930 may be coupled to the I/O hub 920 via at least one of various interfaces, such as a direct media interface (DMI), a hub interface, an enterprise Southbridge interface (ESI), PCIe, etc.

The I/O controller hub 930 may provide various interfaces with peripheral devices. For example, the I/O controller hub 930 may provide a universal serial bus (USB) port, a serial advanced technology attachment (SATA) port, a general purpose input/output (GPIO), a low pin count (LPC) bus, a serial peripheral interface (SPI), a PCI, a PCIe, etc.

In some example embodiments, the processor 910, the I/O hub 920 and the I/O controller hub 930 may be implemented as separate chipsets or separate integrated circuits. In other embodiments, at least two of the processor 910, the I/O hub 920 and the I/O controller hub 930 may be implemented as one chipset.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A clock signal processor for a non-volatile memory device, the clock signal processor comprising:

a duty cycle corrector configured to generate a second clock signal by modifying a duty cycle of a first clock signal;

a switch point calculator configured to activate a switch signal at the end of a latency period in which a read command is provided to the non-volatile memory device and invalid data is read from the non-volatile memory device; and a multiplexer configured to output one of the first and second clock signals as a third clock signal based on the switch signal.

2. The clock signal processor of claim 1, wherein the duty cycle corrector generates the second clock signal by modifying the duty cycle of the first clock signal in the latency period.

3. The clock signal processor of claim 1, wherein the duty cycle corrector modifies the duty cycle of the first clock signal such that the duty cycle of the second clock signal is approximately fifty percent.

4. The clock signal processor of claim 1, wherein the duty cycle corrector includes:

an edge detector configured to bypass the first clock signal, configured to generate a first delayed clock signal by delaying the first clock signal based on delay signals, configured to generate a first inverted clock signal by inverting the first delayed clock signal; and a phase interpolator configured to generate the second clock signal by mixing the first clock signal and the first inverted clock signal.

5. The clock signal processor of claim 4, wherein the edge detector and the phase interpolator are configured to start operating from the latency period.

6. The clock signal processor of claim 4, wherein the duty cycle corrector further includes a delay register configured to store the delay signals.

7. The clock signal processor of claim 6, wherein the edge detector is configured to generate the delay signals and store the delay signals to the delay register when a write command is provided to the non-volatile memory device before execution of the read command; and wherein the phase interpolator is configured to operate from the latency period based on the delay signals stored in the delay register.

8. The clock signal processor of claim 4, wherein a delay length of the second clock signal from the first clock signal is the same as the length of a logic high level duration included in a period of the first clock signal.

9. The clock signal processor of claim 4, wherein the edge detector includes:

a delay chain unit having a plurality of delay units configured to respectively generate temporary delayed clock signals by delaying the first clock signal; and a processing unit configured to generate the delay signals based on the first clock signal and the temporary delayed clock signals, and configured to output one of the temporary delayed clock signals corresponding to an activated delay signal as the first delayed clock signal.

10. The clock signal processor of claim 4, wherein the phase interpolator includes:

a phase mixer configured to generate a mixed clock signal by mixing the first clock signal and the first inverted clock signal; and a schmitt trigger circuit configured to generate the second clock signal by clarifying a logic value characteristic of the mixed clock signal.

11. The clock signal processor of claim 1, wherein the switch point calculator is configured to operate based on the first clock signal, a use signal, and a latency length signal.

12. The clock signal processor of claim 11, wherein the switch point calculator is configured to determine a first period of the first clock signal, after deactivation of the use signal, as the latency period when the latency length signal is 1.

13. The clock signal processor of claim 11, wherein the switch point calculator is configured to determine first and second periods of the first clock signal, after deactivation of the use signal, as the latency period when the latency length signal is 2.

14. The clock signal processor of claim 1, wherein the switch point calculator is configured to deactivate the switch signal before the end of the latency period and is configured to activate the switch signal from the end of the latency period.

15. A non-volatile memory device comprising:

a memory cell array;

a control circuit configured to generate a row address signal and a column address signal based on a command signal and an address signal, the control circuit including a clock signal processor configured to generate a data strobe signal based on a second read clock signal, which is changed from a first read clock signal during a read operation;

an address decoder configured to activate a word line corresponding to the row address signal; and a data I/O circuit configured to receive read data of memory cells connected to the word line through a plurality of bit lines based on the column address signal, and configured to output the read data as a data signal;

the clock signal processor including a duty cycle corrector configured to generate a third read clock signal by modifying the duty cycle of the second read clock signal, a switch point calculator configured to activate a switch signal at the end of a latency period in which a read command is provided as the command signal and invalid data is read from the non-volatile memory device, and a multiplexer configured to output one of the second and third read clock signals as the data strobe signal based on the switch signal.

16. The non-volatile memory device of claim 15, wherein the duty cycle corrector is configured to generate the third read clock signal by modifying the duty cycle of the second read clock signal in the latency period.

17. The non-volatile memory device of claim 15, wherein the duty cycle corrector is configured to modify the duty cycle of the second read clock signal such that the duty cycle of the third read clock signal is approximately fifty percent.

18. The non-volatile memory device of claim 15, wherein the duty cycle corrector includes:

an edge detector configured to bypass the second read clock signal, configured to generate a second delayed read clock signal by delaying the second read clock signal based on delay signals, configured to generate a second inverted read clock signal by inverting the second delayed read clock signal; and a phase interpolator configured to generate the third read clock signal by mixing the second read clock signal and the second inverted read clock signal.

19. The non-volatile memory device of claim 15, wherein the memory cell array includes a three-dimensional memory array in which at least one of word-lines and bit-lines are shared between levels.

20. A method of processing a clock signal comprising:
outputting an input clock signal of a non-volatile memory device as an output clock signal;
generating a modified input clock signal by modifying the duty cycle of the input clock signal during a latency period in which a read command is provided to the non-volatile memory device and invalid data is read from the non-volatile memory device; and
outputting the modified input clock signal as the output clock signal from the end of the latency period.

* * * * *